| (12) | United States Patent | (10) Patent No.: | US 7,710,768 B2 |
|---|---|---|---|
| | Naito | (45) Date of Patent: | May 4, 2010 |

(54) ELECTROMECHANICAL MEMORY, ELECTRIC CIRCUIT USING THE SAME, AND METHOD OF DRIVING ELECTROMECHANICAL MEMORY

(75) Inventor: Yasuyuki Naito, Osaka (JP)

(73) Assignee: Panasonic Corporation, Osaka (JP)

( * ) Notice: Subject to any disclaimer, the term of this patent is extended or adjusted under 35 U.S.C. 154(b) by 333 days.

(21) Appl. No.: 11/813,568

(22) PCT Filed: Jun. 21, 2006

(86) PCT No.: PCT/JP2006/312443

§ 371 (c)(1),
(2), (4) Date: Jul. 9, 2007

(87) PCT Pub. No.: WO2006/137455

PCT Pub. Date: Dec. 28, 2006

(65) Prior Publication Data

US 2009/0003039 A1    Jan. 1, 2009

(30) Foreign Application Priority Data

Jun. 22, 2005  (JP)  ............................. 2005-182476
Jun. 2, 2006   (JP)  ............................. 2006-154590

(51) Int. Cl.
*G11C 11/50*  (2006.01)
(52) U.S. Cl. ................. 365/164; 365/149; 365/151
(58) Field of Classification Search ................. 365/149, 365/151, 164

See application file for complete search history.

(56) References Cited

U.S. PATENT DOCUMENTS

| 4,979,149 A | * | 12/1990 | Popovic et al. | .............. 365/244 |
| 5,677,823 A | * | 10/1997 | Smith | ......................... 361/234 |
| 5,774,414 A | * | 6/1998 | Melzner et al. | ............. 365/244 |

(Continued)

FOREIGN PATENT DOCUMENTS

JP           5-259404         10/1993

(Continued)

OTHER PUBLICATIONS

Jeremy B. Muldavin and Gabriel M. Rebeiz, "Inline Capacitive and DC-Contact MEMS Shunt Switches". IEEE Microwave and Wireless Components Letters. vol. 11, No. 8, Aug. 2001.

(Continued)

*Primary Examiner*—Dang T Nguyen
*Assistant Examiner*—Alexander Sofocleous
(74) *Attorney, Agent, or Firm*—Pearne & Gordon LLP

(57) ABSTRACT

A memory element which has high affinity with a conventional semiconductor process, which has a switching function of completely interrupting electric conduction paths by in a mechanical manner, and in which nonvolatile information recording is enabled is realized. An electromechanical memory which is formed on a substrate, which is formed by interposing a memory cell by electrodes, and which has a movable electrode that is a beam stretched in the air via a post portion is realized. According to the configuration, a nonvolatile memory can be realized by a simple structure, and it is possible to realize a high-performance electromechanical memory which is conventionally difficult to be realized, and in which the power consumption is low and the cost is low, and an electric apparatus using it.

21 Claims, 17 Drawing Sheets

U.S. PATENT DOCUMENTS

| | | | |
|---|---|---|---|
| 6,574,130 B2 * | 6/2003 | Segal et al. | 365/129 |
| 6,625,047 B2 * | 9/2003 | Coleman, Jr. | 365/51 |
| 6,919,592 B2 * | 7/2005 | Segal et al. | 257/209 |
| 6,982,616 B2 * | 1/2006 | Nakanishi et al. | 335/78 |
| 7,071,023 B2 * | 7/2006 | Bertin et al. | 438/99 |
| 7,446,044 B2 * | 11/2008 | Kaul et al. | 438/684 |
| 7,511,994 B2 * | 3/2009 | Aritome | 365/185.01 |
| 2003/0124325 A1 | 7/2003 | Rueckes et al. | |
| 2004/0252590 A1 | 12/2004 | Sharma | |
| 2006/0255395 A1 * | 11/2006 | Fujita et al. | 257/315 |
| 2007/0057278 A1 * | 3/2007 | Nakamura et al. | 257/107 |

FOREIGN PATENT DOCUMENTS

| | | |
|---|---|---|
| JP | 9-307073 | 11/1997 |
| JP | 11-297931 | 10/1999 |
| JP | 2000-12793 | 1/2000 |
| JP | 2000-31397 | 1/2000 |
| JP | 2002-366058 | 12/2002 |
| JP | 2005-5718 | 1/2005 |
| JP | 2005-514784 | 5/2005 |

OTHER PUBLICATIONS

Y. Asao, et al. "Design and Process Integration for High-Density, high-Speed, and Low-Power 6F2 Cross Point MRAM Cell". Corporate Research and Development Center, Toshiba Corporation. 2004.

* cited by examiner

|  | WRITING | READING |
|---|---|---|
| BIT LINE | $V_d$ | 0 V |
| WORD LINE | 0 V | $V_d$ |

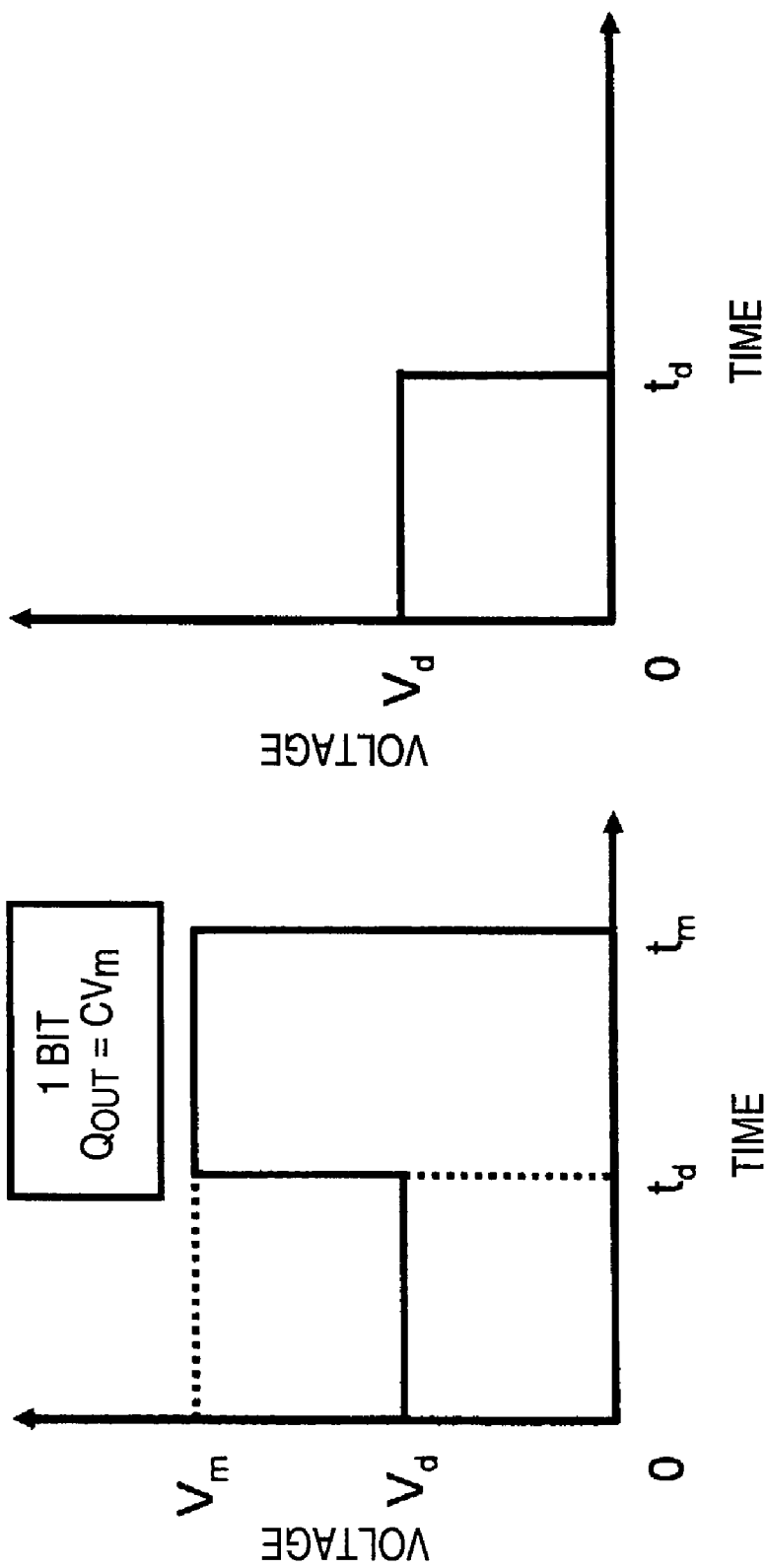

ELECTROMECHANICAL MEMORY, ELECTRIC CIRCUIT USING THE SAME, AND METHOD OF DRIVING ELECTROMECHANICAL MEMORY

TECHNICAL FIELD

The present invention relates to a memory element due to the microelectromechanical system, and also to an electric circuit using it.

BACKGROUND ART

Under the situation where the function of an information communication apparatus such as a wireless terminal is being enhanced, increase of the adaptive information amount of an information apparatus is essential in provision of services to meet needs of users. In a memory for a wireless terminal, performances such as reduced size, large capacity, and low power consumption are requested. Currently, semiconductor memories of DRAM (Dynamic Random Access Memory), SRAM (Static Random Access Memory), and SDRAM (Static Dynamic Random Access Memory) are used. A DRAM is a storage device which requires a record holding operation, and has a problem of increased power consumption.

At present, research and development of reduction of power consumption are advanced. A technique of incorporating a function of suppressing a refresh operation to a minimum level to reduce the power consumption of a DRAM for a personal computer to 1/10 has been developed. A memory is provided with PASR (Partial Array Self Refresh) which is a function of dividing the memory into blocks and refreshing only a required block, and TCSR (Temperature Compensated Self Refresh) which is a function of automatically determining an optimum refresh time in accordance with the temperature to extend the average refresh time. At a clock frequency of 100 MHz, the data transfer rate is 400 Mbyte/s, and the power source voltage is 1.8 V which is usually used in a portable telephone (Elpida Memory, May 2004).

Furthermore, also research and development of an SDRAM which is to be used in a wireless terminal, and which combines high speed of an SRAM and large capacity of a DRAM are conducted. In such an SDRAM, the DDR (Double Data Rate) technique is applied, and techniques for reducing power consumption such as the data transfer rate of 1.1 Gbyte/s, 256 MB, PASR, and TCSR are employed. It is a technique directed to a use of displaying of a three-dimensional motion picture in a portable apparatus such as a portable telephone, or a PDA (Samsung Electronics, May 2004). In a semiconductor memory element, recording of 1, 0 bits of information is performed by means of accumulation or discharging of charges in a capacitor. Temporal deterioration of information due to reduction of the amount accumulated charges occurs in a volatile memory. When paths along which charges escape are completely interrupted, this phenomenon can be avoided. In electrical switching by transistors, however, it is difficult to completely interrupt electric conductive paths, and the phenomenon inevitably occurs. Therefore, it is required to perform the record holding operation at constant time intervals. The operation causes the power consumption to be increased.

Accordingly, research and development of a nonvolatile memory element which is to be replaced with a conventional memory element are conducted. An MRAM (Magnetic Random Access Memory), and an FeRAM (Ferroelectric Random Access Memory) are configured so that a magnetic material or a dielectric material is used as a memory cell, and magnetic polarization or electric polarization is used as a record data which can be semipermanently held. This technique does not require a record holding operation, and hence is expected as a memory element technique which can realize low power consumption. Therefore, such a memory is contemplated to be applied to a field in which reduction of power consumption is important, such as a portable terminal.

As a device which has high affinity with a conventional semiconductor process, and in which interruption of electric conductive paths is enabled, an electromechanical switch which is produced by the microelectromechanical systems (MEMS) technique is being vigorously researched and developed. Originally, the research field is mainly directed to an RF-MEMS switch which switches over a propagation path for a high-frequency signal in a wireless communication terminal. An RF-MEMS switch is a switch in which a micro movable electrode is moved to mechanically switch over a signal transmission path. The switch has an advantage that high-frequency characteristics such as very low loss and high isolation are excellent.

Furthermore, the switch can be produced by a process which has high affinity with an RF-IC. Therefore, the switch can be incorporated in an RF-IC, and is expected as a technique which significantly contributes to size reduction of a radio component.

As a switch having a size of about several hundreds of μm, conventionally, a switch described in Non-patent Reference 2 has been known. In the switch, a signal line through which a high-frequency signal is transmitted is formed on a membrane, and a control electrode is disposed just below the signal line. When a DC potential is applied to the control electrode, the membrane is attracted toward the control electrode by an electrostatic attractive force to deflect, and makes contact with a ground electrode formed on a substrate, whereby the signal line formed on the membrane is set to a short-circuited state, a signal flowing through the signal line is attenuated, and the line is interrupted. By contrast, when a DC potential is not applied to the control electrode, the membrane does not deflect, and a signal flowing through the signal line on the membrane is not lost from the ground electrode, and passes through the switch.

As a memory element to which an electromechanical switch is applied, there is an electromechanical switch disclosed in Patent Reference 1. Patent Reference 1 discloses a structure in which a capacitor to perform accumulation is selected by an electromechanical switch, and accumulated charges are gradually consumed for a constant time period by a light emitting element. The light emitting element has a memory function of a constant time period.

Patent Reference 1: JP-A-2002-366058

Non-patent Reference 1: Y. Asao et al., in Int. Electron Device Meeting Tech. Dig., December 2004.

Non-patent Reference 2: J. B. Muldavin and G. M. Rebeiz, IEEE Microwave Wireless Compon. Lett., vol. 11, pp. 334-336, August 2001.

DISCLOSURE OF THE INVENTION

Problems that the Invention is to Solve

At present, however, the configuration of a nonvolatile memory such as shown in Non-patent Reference 1 has an important problem in that transistors and memory cells are integrated with each other by a complex process technique, and the production cost is reduced in what way. Merging of a magnetic process or a dielectric process with a conventional semiconductor process causes a process line to be contaminated by foreign materials, and there arises a technical problem in stable production of high-performance products. In order to construct a new dedicate production line, a large investment is required.

It is necessary to realize a memory element which has high affinity with a conventional semiconductor process, which has a switching function of completely interrupting electric conduction paths by in a mechanical manner, and in which nonvolatile information recording is enabled.

The light emitting element of Patent Reference 1 is configured so that writing of data into a capacitor (charge accumulation in the capacitor) is enabled, but reading is disabled. Therefore, it is difficult to use the element as a memory element.

Means for Solving the Problems

In order to attain the object, the electromechanical memory of the invention comprises: a memory portion formed on a substrate so that a memory cell is interposed between a first electrode and a second electrode; and a switching portion which has a movable electrode that is a beam-like member stretched above a post portion formed on the substrate, while being separated from the first electrode by a predetermined distance, and which is formed so that an electric conductive path can be formed between the first electrode and the movable electrode by displacement of the movable electrode caused by an electrostatic force, the memory being able to write and read data into and from the memory cell.

According to the configuration, a nonvolatile memory can be realized by a simple structure, and it is possible to realize a high-performance electromechanical memory which is conventionally difficult to be realized, and in which the power consumption is low and the cost is low. Since the memory cell, and the switching portion which mechanically turns on and off the electric conductive path to perform switching are integrated with each other, a current which may flow in the off-state can be completely interrupted. Therefore, reduction of the power consumption and the cost of the memory can be realized.

Furthermore, the electromechanical memory of the invention includes a configuration where the electrostatic force is produced by a potential difference between a driving electrode placed in the vicinity of the memory portion, and the movable electrode.

According to the configuration, the driving electrode and the memory portion are electrically separated from each other, and the reading operation by the movable electrode and the writing operation into the memory portion can be independently controlled. Since the driving electrode is separately disposed, the driving is facilitated, and the memory can be configured by a very simple driving circuit.

Furthermore, the electromechanical memory of the invention includes a configuration where the driving electrode is configured by two stationary electrodes which are juxtaposed on both sides of the memory portion.

According to the configuration, the driving electrode is disposed on the both sides of the first electrode which constitutes the conductive path. Therefore, displacement of the movable electrode can be easily realized while maintaining balancing. Moreover, one electromechanical memory element can record plural record data, and a one-switch and plural-memory cell configuration can be formed to expand the record capacity.

Furthermore, the electromechanical memory of the invention includes a configuration where the electrostatic force is produced by a potential difference between the second electrode and the movable electrode.

According to the configuration, the electrostatic force with respect to the movable electrode can be produced without separately forming a driving electrode, and hence the memory can be configured by a very simple configuration.

Furthermore, the electromechanical memory of the invention includes a configuration where the memory portion is configured by a plurality of juxtaposed memory portions.

According to the configuration, the capacity can be increased.

Furthermore, the electromechanical memory of the invention includes a configuration where, in the memory portions, at least one of the first and second electrodes is connected to a common potential.

According to the configuration, further size reduction can be realized. Moreover, a control signal for the movable electrode or the driving electrode can be simplified.

Furthermore, the electromechanical memory of the invention includes a configuration where at least one of the first and second electrodes of the memory portions is connected to potentials which are independent of each other.

According to the configuration, an independent memory control is enabled.

Furthermore, the electromechanical memory of the invention includes a configuration where the driving electrode is formed so as to butt against the memory portion or the post portion via an insulating film which covers a sidewall of the driving electrode.

According to the configuration, margins in formation of patterns for the memory portion, the post portion, and the driving electrode are not necessary, and the memory portion and the post portion can be made close to the driving electrode to the maximum extent. Therefore, further miniaturization is enabled, and there arises no possibility of a short circuit, so that the reliability can be improved.

Furthermore, the electromechanical memory of the invention includes a configuration where the driving electrode is opposed to the movable electrode via an insulating film.

According to the configuration, even when the movable electrode is displaced to a degree at which the driving electrode and the movable electrode butt against each other, the butting state can be maintained because the insulating film is interposed. Therefore, stable switching is enabled. Since the driving electrode and the memory portion can be formed at an approximately same height, the surface can be flattened, and the pattern formation is facilitated, so that pattern formation of higher accuracy is enabled.

Furthermore, the electromechanical memory of the invention includes a configuration where the post portion is formed so as to butt against the memory portion via an insulating film which covers a sidewall of the memory portion.

According to the configuration, a margin in formation of a pattern for the memory portion is not necessary, and the memory portion can be made close to the post portion to the maximum extent. Therefore, further miniaturization is enabled, and there arises no possibility of a short circuit, so that the reliability can be improved.

Furthermore, the electromechanical memory of the invention includes a configuration where a second memory portion is disposed so as to be symmetrical to the memory portion across the movable electrode.

According to the configuration, it is possible to form a large-capacity electromechanical memory. The symmetry in this context does not always mean positional symmetry. When the second memory portion is formed so as to have a comparable capacity, the workabilities of writing and reading can be improved. Memory portions are disposed in different sides across the movable electrode, and, during release of one memory portion, the other memory portion may be driven, whereby the restoring force of the movable electrode can be enhanced and the memory can be driven at a higher speed.

Furthermore, the electromechanical memory of the invention includes a configuration where the memory is formed so that an area of the memory portion is larger than an area opposed to the movable electrode.

According to the configuration, it is possible to increase the capacity.

Furthermore, the electromechanical memory of the invention includes a configuration where the memory is formed so that an area of the second electrode is larger than an area of the first electrode.

According to the configuration, it is possible to realize a high output power. Moreover, it is possible to reduce shielding of an electric field between the second electrode and the movable electrode, due to an electric field between the charged first electrode and the movable electrode.

Furthermore, the electromechanical memory of the invention includes a configuration where a plurality of electromechanical memories are formed on the substrate, and the movable electrode constitutes a bit line.

According to the configuration, the integrability can be enhanced, and the memory can be produced by a simple process. Therefore, the production cost can be reduced.

Furthermore, the electromechanical memory of the invention includes a configuration where a plurality of electromechanical memories are formed on the substrate, and the driving electrode constitutes a word line.

According to the configuration, an operation of recording to the memory cell can be separated from that of driving the movable electrode, so that mixture of signals of the operations can be prevented from occurring.

Furthermore, the electromechanical memory of the invention includes a configuration where a plurality of electromechanical memories are formed on the substrate, and the second electrode constitutes a word line.

According to the configuration, the integrability can be enhanced, and the memory can be produced by a simple process. Therefore, the production cost can be reduced.

Furthermore, the electromechanical memory of the invention includes a configuration where the memory cell is formed by an insulating material.

According to the configuration, a capacitor can be formed by an economical material.

Furthermore, the electromechanical memory of the invention includes a configuration where the memory cell is formed by a dielectric material.

Furthermore, the electromechanical memory of the invention includes a configuration where the electrodes between which the memory cell is interposed are formed by a magnetic material.

According to the configuration, a nonvolatile memory can be realized, and it is possible to realize a high-performance electromechanical memory which is conventionally difficult to be realized, and in which the power consumption is low and the cost is low, and an electric apparatus using it.

According to an electric circuit using the electromechanical memory of the invention, it is possible to realize a high-performance electromechanical memory which is conventionally difficult to be realized, and in which the power consumption is low and the cost is low, and an electric apparatus using it.

The invention provides a method of driving an electromechanical memory for performing the writing and reading data into and from the memory cell, the method comprises: providing the electromechanical memory which includes a memory portion which is formed on a substrate so that a memory cell is interposed between a first electrode and a second electrode, and a switching portion which has a movable electrode that is a beam-like member stretched above a post portion formed on the substrate, while being separated from the first electrode by a predetermined distance, and which is formed so that an electric conductive path can be formed between the first electrode and the movable electrode caused by displacement of the movable electrode by an electrostatic force produced by a potential difference between the second electrode and the movable electrode; and controlling a potential of the second electrode so that a writing voltage is higher than a writing switch driving voltage and a reading switch driving voltage in the writing, thereby performing writing and reading.

According to the configuration, it is possible to realize a memory element in which a reading operation is enabled by controlling a voltage which is to be applied to the second electrode. Moreover, a word line and the second electrode can be used in common, the number of terminals is reduced by adjusting a driving voltage, and size reduction can be performed.

Effects of the Invention

As described above, according to the invention, a memory cell, and a switch which allows mechanically interruption of an electric conductive path are integrated with each other, and hence a nonvolatile memory of a simple structure can be realized, and it is possible to realize a high-performance electromechanical memory which is conventionally difficult to be realized, and in which the power consumption is low and the cost is low, and an electric apparatus using it.

A one-switch and plural-memory cell configuration can be formed, and excellent expandability to a large capacity can be provided.

The electromechanical switch of the invention can be applied not only to an electric circuit for wireless communication, but also to electric circuits in various fields.

The electromechanical switch of the invention can be applied not only to a wireless communication terminal, but also to electric apparatuses in various fields.

BRIEF DESCRIPTION OF THE DRAWINGS

FIG. 9 is a view showing a control signal of the electromechanical memory of Embodiment 3 of the invention.

Figure 1:
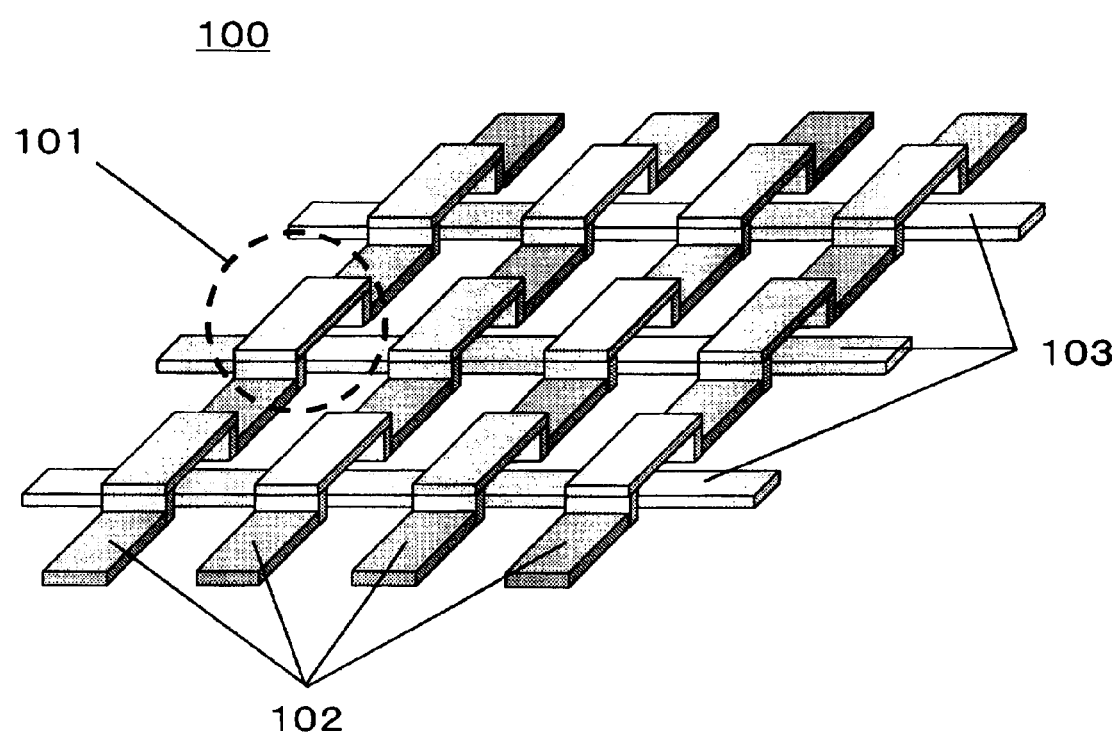
FIG. 1 is a perspective view showing the configuration of an electromechanical memory of Embodiment 1 of the invention.

DESCRIPTION OF REFERENCE NUMERALS AND SIGNS 100 electromechanical memory
101, 201, 301, 401, 501, 601, 701, 801, 901, 1101, 1102, 1201 electromechanical memory element
102 bit line
103, 103a, 103b word line
104 movable electrode
105, 105a, 105b memory cell
106, 106a, 106b floating electrode (first electrode)
107 lower electrode (second electrode)
108 post portion
109 insulating film
209 insulating film
110 substrate
111 sacrifice layer

BEST MODE FOR CARRYING OUT THE INVENTION

Hereinafter, embodiments of the invention will be described in detail with reference to the drawings.

Embodiment 1

FIG. 1 is a perspective view showing the configuration of an electromechanical memory of Embodiment 1 of the invention. In the electromechanical memory 100 shown in FIG. 1, electromechanical memory elements 101 are formed at positions where bit lines 102 and word lines 103 intersect with each other, and the electromechanical memory elements 101 are arranged in a matrix pattern. The bit lines 102 have a structure in which they are formed in the air above the word lines 103.

Figure 2A:
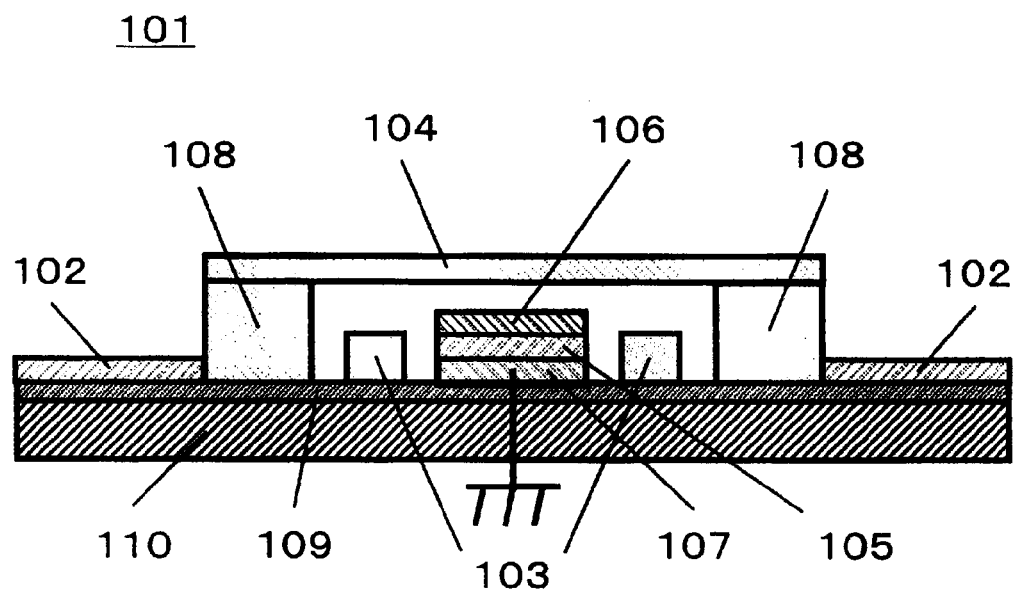
FIG. 2(a) is a sectional view showing the configuration of the electromechanical memory of Embodiment 1 of the invention.
Figures 4, 5:
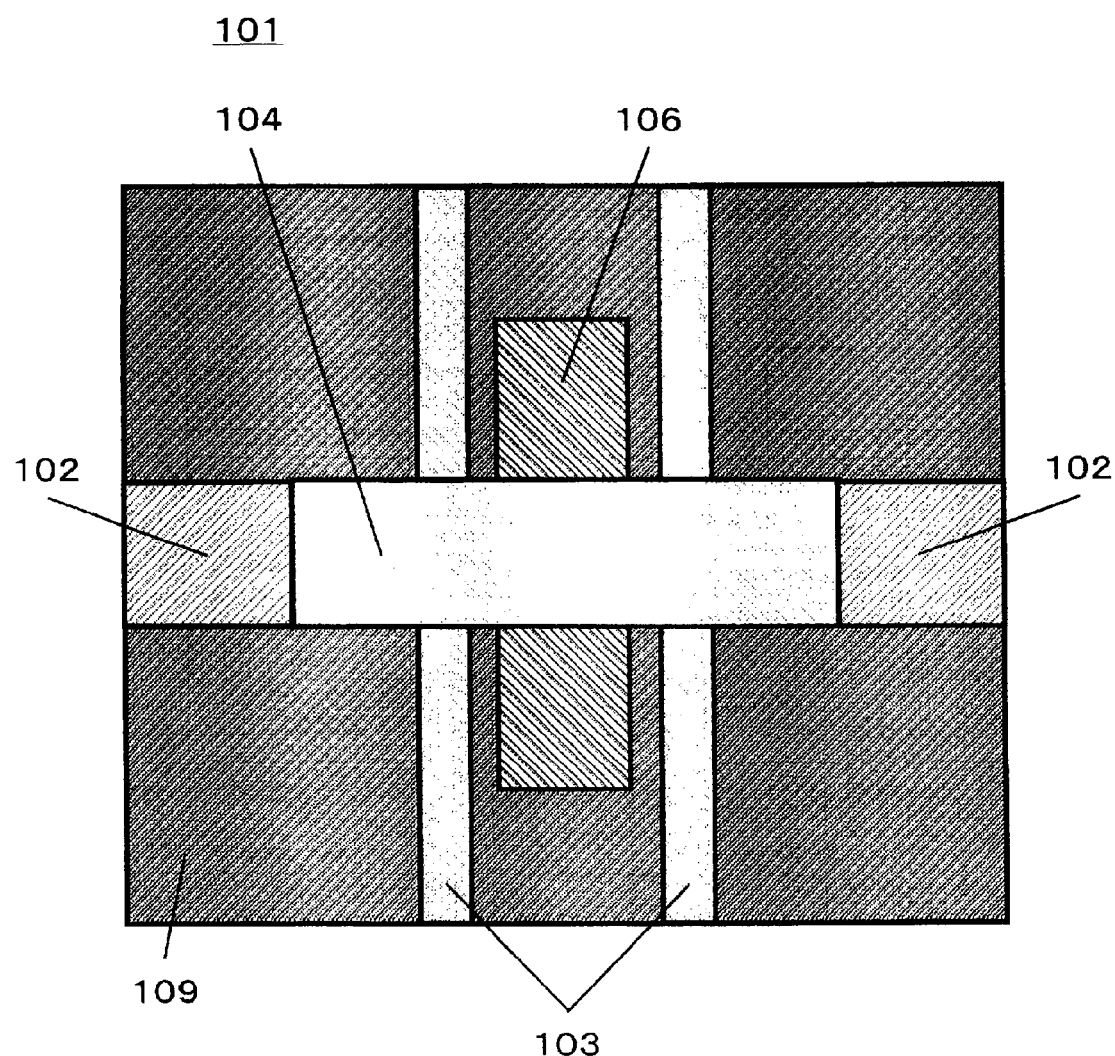
FIG. 4 is a view showing the control signal of the electromechanical memory of Embodiment 1 of the invention.
FIG. 5 is a plan diagram of an electromechanical memory of Embodiment 2 of the invention.

FIG. 2(a) is a sectional view showing the configuration of the electromechanical memory of Embodiment 1 of the invention, and shows a section along the direction of the bit lines 102 in FIG. 1. FIG. 5 is a plan diagram of the memory. In the electromechanical memory element 101, a floating electrode 106 serving as a first electrode, and a lower electrode 107 serving as a second electrode which are formed so as to sandwich a memory cell 105 are formed on a substrate 110 in which an insulating film 109 is formed on the surface. A movable electrode 104 consisting of a beam which is stretched in the air via a post portion 108 is formed. The movable electrode 104 and the post portion 108 form the same electric conductive path as the bit line 102. The word lines 103 are formed on the both sides of the memory cell 105. The word lines on the both sides may be formed as one line, but are disposed with being branched to the both sides in order to increase an electrostatic force.

Figure 2B:
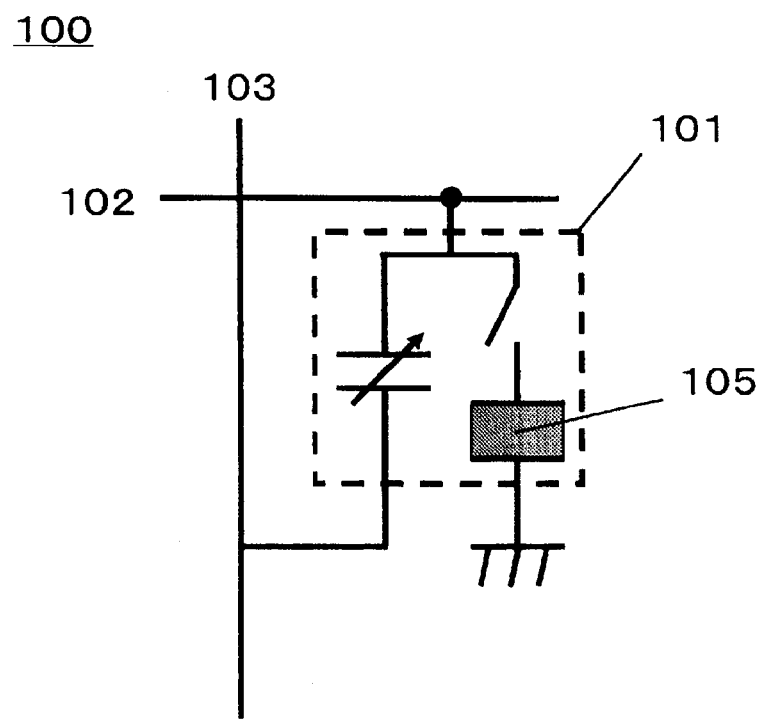
FIG. 2(b) is a circuit diagram showing the configuration of the electromechanical memory of Embodiment 1 of the invention.

FIG. 2(b) is a circuit diagram showing the configuration of the electromechanical memory of Embodiment 1 of the invention, and shows in the form of a block diagram of the configuration of the electromechanical memory 100 illustrated in FIG. 2(a).

The mechanism of writing and reading in recording in the electromechanical memory 100 will be described.

Figure 3A:
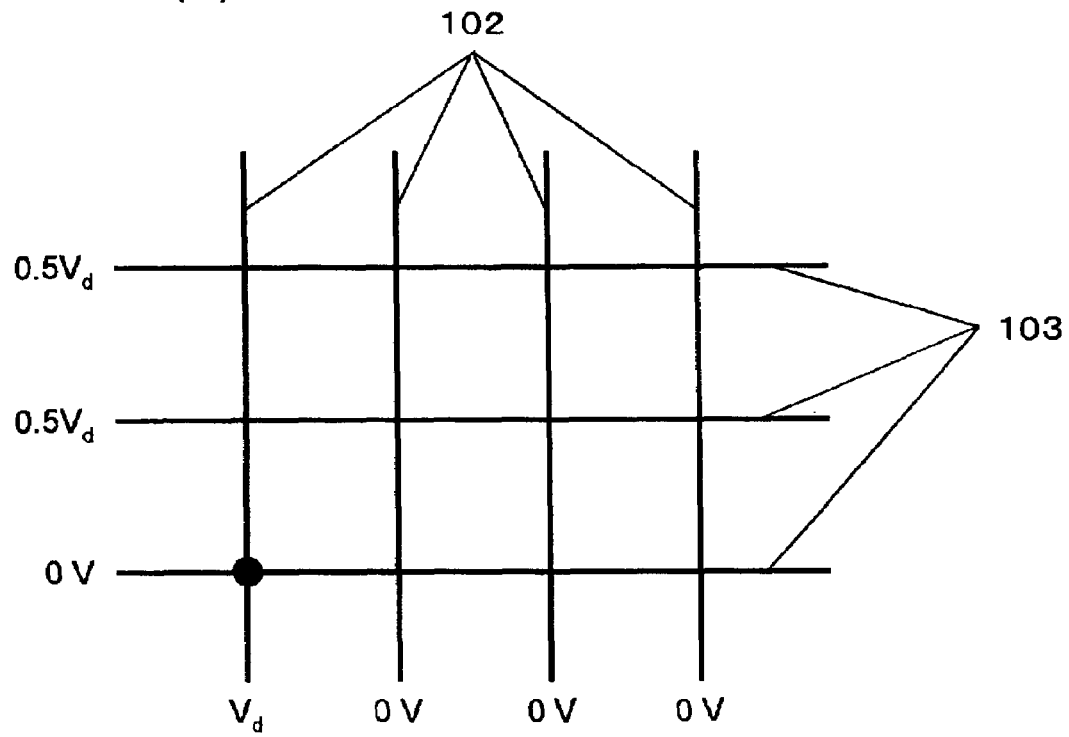
FIG. 3 is a diagram showing a control signal of the electromechanical memory of Embodiment 1 of the invention, (a) shows writing, and (b) shows reading.
Figure 3B:
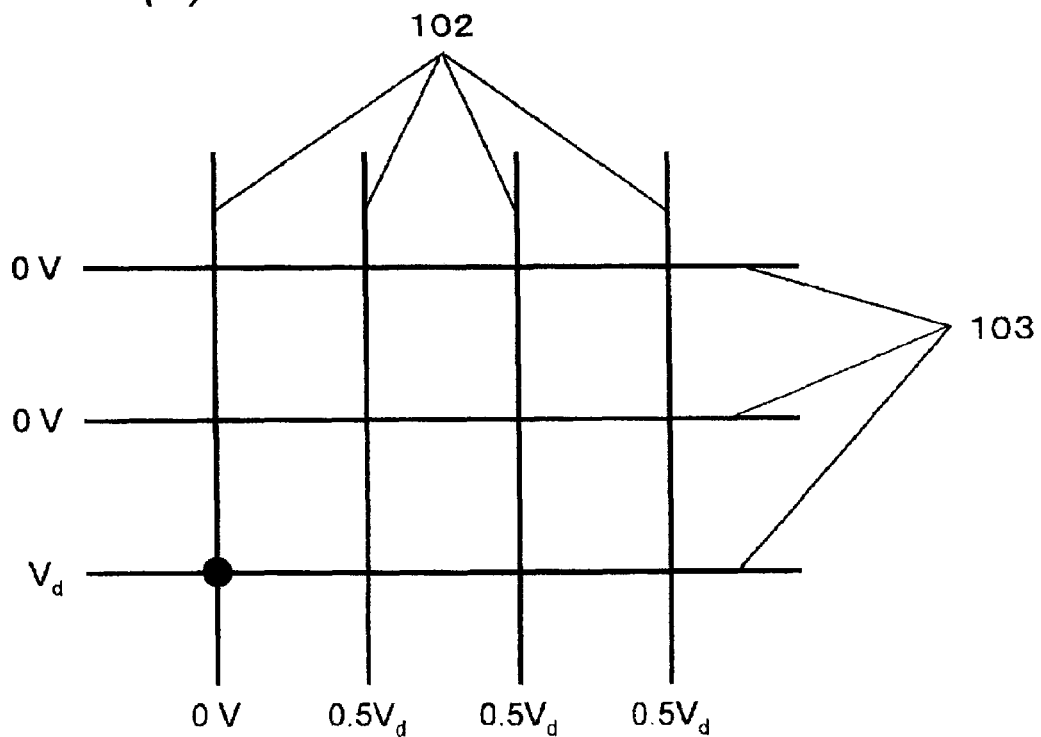

FIG. 3 is a diagram showing a control signal of the electromechanical memory of Embodiment 1 of the invention, FIG. 3(a) shows writing, and FIG. 3(b) shows reading.

In writing, in order to select an electromechanical memory element 101 into which data 1 or 0 is to be written from the electromechanical memory elements 101 arranged in a matrix pattern, first, a voltage is applied to both the bit line 102 and word line 103 which intersect with each other at the position (indicated by the black dot in FIG. 3) of the electromechanical memory element 101 to be made active, so that a potential difference that is equal to the driving voltage Vd of the electromechanical memory element 101 is produced between the bit line 102 and the word line 103.

A voltage is applied to the word lines 103 and bit lines 102 which are not involved in the element selection, so that unwanted electromechanical memory elements 101 are not made active. In order to make the potential difference smaller than Vd, an intermediate potential between 0 and Vd is applied. FIG. 3 shows the case of 0.5 Vd.

FIG. 4 is a view showing the control signal of the electromechanical memory of Embodiment 1 of the invention. Since the bit line 102 is connected to the movable electrode 104 as shown in FIG. 2, the potential differential is applied between the movable electrode 104 and the word line 103, and an electrostatic force is generated.

In writing, the driving voltage or Vd is applied to the bit line 102, and 0 V is applied to the word line 103. Here, the state where writing is performed on the bit line 102 at the left end is shown. The movable electrode 104 in the relevant place is downward driven by the electrostatic force to make contact with the floating electrode 106. Namely, a variable capacitor is formed between the bit line 102 and the word line 103, and at the same time a switch is formed between the bit line 102 and the floating electrode 106. A potential is supplied to the floating electrode 106 in which the switch is set to the ON-state, and a potential difference is produced between the floating electrode and the lower electrode 107 which is connected to the ground potential. In the case where the memory cell 105 is formed by an insulating material, the floating electrode 106 and the lower electrode 107 sandwich the insulating material functioning as the memory cell, to constitute a capacitor, and therefore charges are accumulated because of the potential difference between the electrodes. This state is a state where data 1 is recorded.

After the charge accumulation into the capacitor is completed, the voltage applied to the bit line 102 is set to 0 V, whereby the bit line is made to have the same potential as the word line 103, and the electrostatic force can be eliminated. The movable electrode 104 is upward driven by the elastic force of the doubly-supported beam to completely interrupt the electric conductive path to the floating electrode 106 in a mechanical manner, thereby attaining a switch OFF-state. According to this mechanism, an electric conductive path along which charges that have been once accumulated can escape is eliminated, and hence a nonvolatile memory in which recording does not deteriorate can be realized.

In reading, in order to select an electromechanical memory element 101 from which recording is to be read from the electromechanical memory elements 101 arranged in a matrix pattern, a potential difference is applied between the bit line 102 and word line 103 which intersect with each other at the position of the electromechanical memory element 101 to be made active. In contrast to writing, 0 V is applied to the bit line 102, and the driving voltage Vd is applied to the word line 103. The movable electrode 104 is downward driven by an electrostatic force to make contact with the floating electrode 106. In the case where charges are accumulated between the floating electrode 106 and the lower electrode 107 constituting the capacitor, i.e., the case where data 1 is recorded, the charges escape to the contacting movable electrode 104, and an output is taken out from the bit line 102.

In the case where charges are not accumulated, i.e., the case where data 0 is recorded, an output is not obtained. In this case, since the floating electrode 106 and the lower electrode 107 connected to the ground have the same potential, new charge accumulation does not occur, and only the operation of reading out the accumulated charges is executed.

Writing of data 0 is identical with the reading operation. In the case where data 1 is already recorded, the data is rewritten to data 0, and, in the case where data 0 is already recorded, data 0 is rewritten.

In the recording writing/reading time (access time), the response time in the electromechanical driving of the movable electrode 104 is dominant. In the case where the movable electrode has a width of 5 μm, a thickness of 250 nm, and a length of 20 μm, and the gap between the movable electrode 104 and the word line 103 is 130 nm, it is possible to realize a response time of 20 nsec, and hence rapid access can be realized.

As described above, the word line and memory cell in the electromechanical memory element are electrically separated from each other, thereby allowing the reading/writing operation by the electromechanical switch and the writing operation into the memory cell to be independently controlled. It is possible to realize a nonvolatile electromechanical memory which performs operations of writing and reading a record.

According to the configuration, a nonvolatile memory can be realized by a simple structure, and a high-performance electromechanical memory which is conventionally difficult to be realized, and in which the power consumption is low and the cost is low can be realized. Furthermore, an electric apparatus such as a portable telephone can be formed by using the electromechanical memory.

In the electromechanical memory of the invention, it is possible to randomly access the electromechanical memory elements which are arranged in a matrix pattern. The memory can be used as a RAM.

As shown in FIG. 5, the size of the stack structure of the floating electrode 106, the memory cell 105, and the lower electrode 107 can be increased.

According to the structure, the area of the memory cell can be widened, so that the electrostatic capacitance and the output can be increased.

In Embodiment 1, the case where the memory cell has a rectangular shape has been described. The memory cell may have any shape including a circular shape, and may be formed into any shape as far as the space allows.

In the invention, the bit line 102 and the word line 103 may be formed in inverse relationship, or the bit line 102 may be formed as a word line, and the word line 103 as a bit line.

In the electromechanical memory element 101 in Embodiment 1, the word line 103 is formed as two lines. Alternatively, the word line may be formed as a single line or three or more lines.

In the invention, the intervals of the bit line 102 between the electromechanical memory elements may be set more finely, and are requested to attain electrical insulating separation. It is possible to realize a high density of the electromechanical memory.

In the invention, the intervals of the electromechanical memory elements in the direction of the word line may be reduced in a range where adjacent elements do no interfere with each other. It is possible to realize a high density of the electromechanical memory.

In the invention, the size of the electromechanical memory element may be reduced to the minimum dimension in the microfabrication. It is possible to realize a high density of the electromechanical memory.

In the invention, the memory cells can be formed by a dielectric material including ferroelectric PZT or BST, or the like. Depending on the direction of the electric field applied between electrodes sandwiching a memory cell, the direction of electric polarization in the dielectric material is controlled, and data 1 or 0 is recorded. In reading of the record, a change in the amount or polarity of charges excited in the electrode is output through the bit or word line. In this case, attention must be paid to drive the movable electrode by a voltage generating an electric field that is lower in level than that in which inversion of electric polarization occurs, thereby preventing the record from being broken.

In the invention, the electrodes sandwiching the memory cell may be formed by a magnetic material. In this case, depending on the directions of currents flowing through the bit and word lines, the direction of a mixed magnetic field generated by the currents is controlled, and the magnetization direction of the one electrode is controlled, whereby data 1 or 0 is written. In the case where the magnetization directions of the electrodes are parallel, the resistance is low, and, in the case of antiparallel, the resistance is high. Therefore, the level of the spin-dependent tunneling current which flows between the electrodes through the insulating film of the memory cell is changed. In reading of the record, the movable electrode and the floating electrode are made contact with each other, data 1 or 0 based on the amount of the current flowing between the electrodes is output through the bit or word line. In this case, the control signal must be given so that, for example, the driving voltage Vd is applied to the bit line, and 0 V is applied to the word line 103, and a potential difference is applied between the electrodes.

The electromechanical memory of the invention can be applied not only to an electric circuit for wireless communication, but also to electric circuits in various fields.

The electromechanical memory of the invention can be applied not only to a wireless communication terminal such as a portable telephone, but also to electric apparatuses in various fields.

Embodiment 2

FIG. 6 is a view showing the configuration of an electromechanical memory of Embodiment 2 of the invention. In the electromechanical memory 200 shown in FIG. 6, electromechanical memory elements 201 are formed at positions where the bit lines 102 and word lines 103a and 103b intersect with each other, and the electromechanical memory elements 201 are arranged in a matrix pattern. The movable electrodes 104 connected to the bit lines 102 have a structure in which they are formed in the air above the word lines 103a and 103b.

Figure 6A:
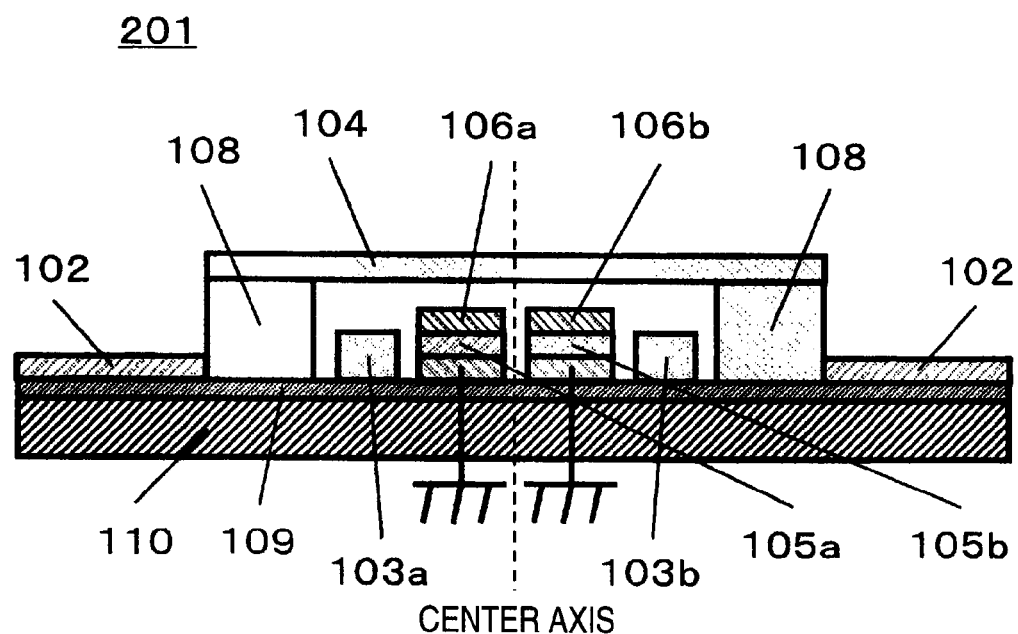
FIG. 6(a) is a sectional view showing the configuration of the electromechanical memory of Embodiment 2 of the invention.

FIG. 6(a) is a sectional view showing the configuration of the electromechanical memory of Embodiment 2 of the invention, and shows a sectional view along the direction of the bit lines 102. The electromechanical memory element 201 shown in FIG. 6(a) is different from the electromechanical memory element 101 shown in Embodiment 1 in that the memory cell, floating electrode, and lower electrode which constitute a capacitor are split into two portions, and a 2-bit memory element is configured for one bit line. They are indicated as memory cells 105a, 105b, and floating electrodes 106a, 106b. Two independent word lines 103a, 103b are inserted into one electromechanical memory element 201, and formed on both sides of the memory cells 105a, 105b, respectively.

Figure 6B:
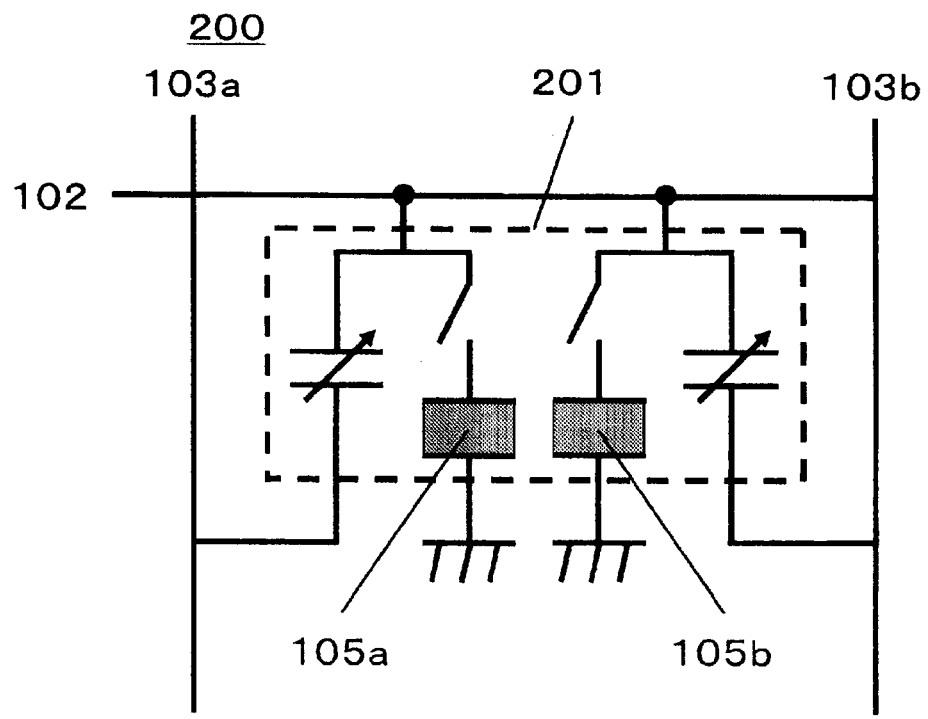
FIG. 6(b) is a circuit diagram showing the configuration of the electromechanical memory of Embodiment 2 of the invention.

FIG. 6(b) is a circuit diagram showing the configuration of the electromechanical memory of Embodiment 2 of the invention, and shows in the form of a block diagram of the configuration of the electromechanical memory 200 illustrated in FIG. 6(a).

Basic mechanisms of writing and reading a record are identical with those of the electromechanical memory 100 of Embodiment 1. In the electromechanical memory 200 of Embodiment 2, however, two record data can be recorded by one electromechanical memory element 201, or the record capacity can be expanded from a one-switch and one-memory cell configuration to a one-switch and two-memory cell configuration.

The mechanism of selecting a memory cell in recording in the electromechanical memory 200 will be described.

When a potential difference is applied between the word line 103a and the bit line 102, an electrostatic force is applied while being biased toward the word line 103a with respect to the center axis of FIG. 6(a), and the movable electrode 104 is downward bent asymmetrically with respect to the center axis, and makes contact with the floating electrode 106a. In this case, the movable electrode 104 approaches the floating electrode 106b, but does not make contact therewith. In the two memory cells 105a, 105b, only the memory cell 105a is accessed, and the selection is performed through the word lines 103a, 103b. In the case where the memory cell 105b is to be accessed, the word line 103b is similarly used.

In Embodiment 2 of the invention, the case of two memory cells has been described. A plurality of memory cells or word lines corresponding thereto may be formed.

As described above, according to the electromechanical memory of Embodiment 2, one electromechanical memory element can record plural record data, and a one-switch and plural-memory cell configuration can be formed to expand the record capacity.

Embodiment 3

FIG. 7 is a view showing the configuration of an electromechanical memory of Embodiment 3 of the invention. In the electromechanical memory 300 shown in FIG. 7, electromechanical memory elements 301 are formed at positions where the bit lines 102 and the word lines 103 intersect with each other, and the electromechanical memory elements 301 are arranged in a matrix pattern. The embodiment is characterized in that the word line 103, and the lower electrode 107 in Embodiments 1 and 2 are used in common. In the same manner as Embodiments 1 and 2, above the word line 103, the movable electrode 104 connected to the bit line 102 is formed in the air to configure a structure in which the beam-like movable electrode 104 is formed.

Figure 7A:
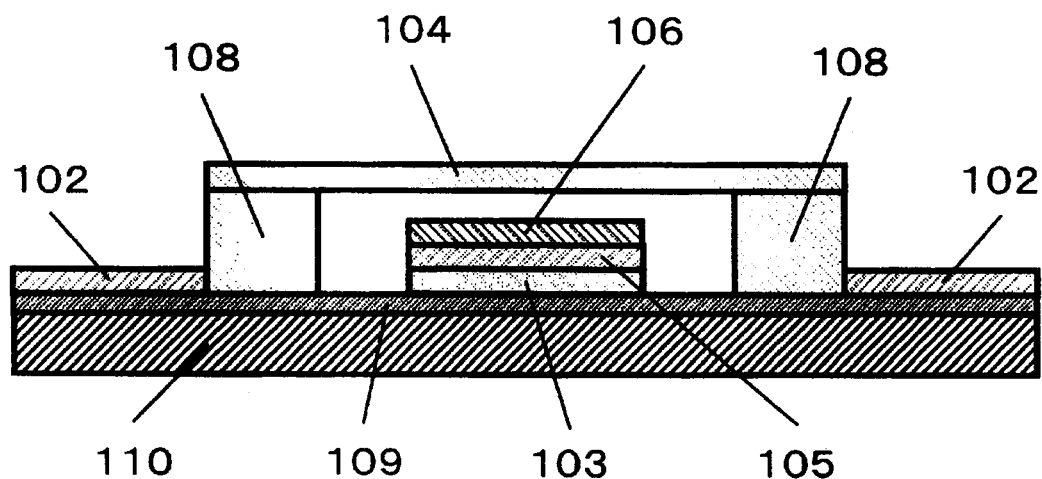
FIG. 7(a) is a sectional view showing the configuration of an electromechanical memory of Embodiment 3 of the invention.

FIG. 7(a) is a sectional view showing the configuration of the electromechanical memory of Embodiment 3 of the invention, and shows a sectional view along the direction of the bit line 102. In the electromechanical memory 301 shown in FIG. 7(a), a floating electrode 106 and word line 103 which are formed so as to sandwich the memory cell 105 are formed on the substrate 110 in which the insulating film 109 is formed on the surface. The movable electrode 104 constituting of a beam which is stretched in the air via the post portion 108 is formed. The movable electrode 104 and the post portion 108 form the same electric conductive path as the bit line 102.

Figure 7B:
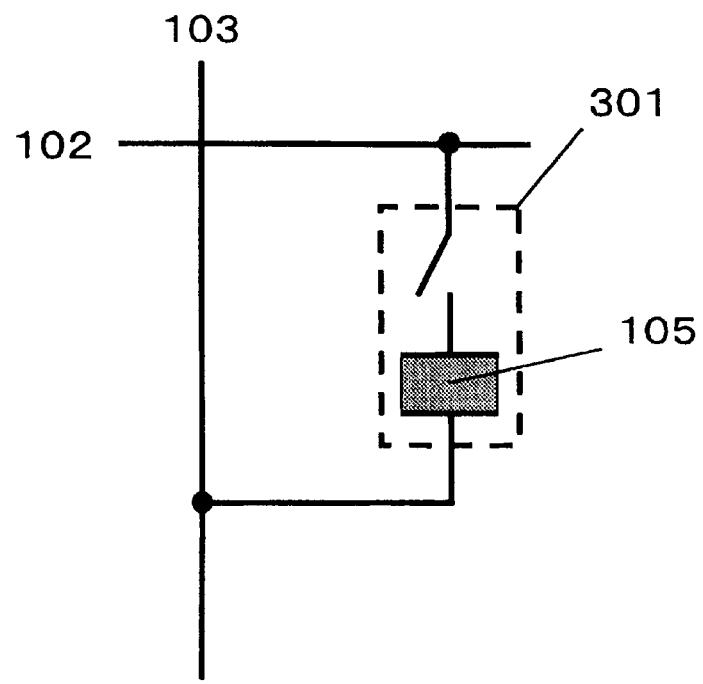
FIG. 7(b) is a circuit diagram showing the configuration of the electromechanical memory of Embodiment 3 of the invention.
Figure 8:
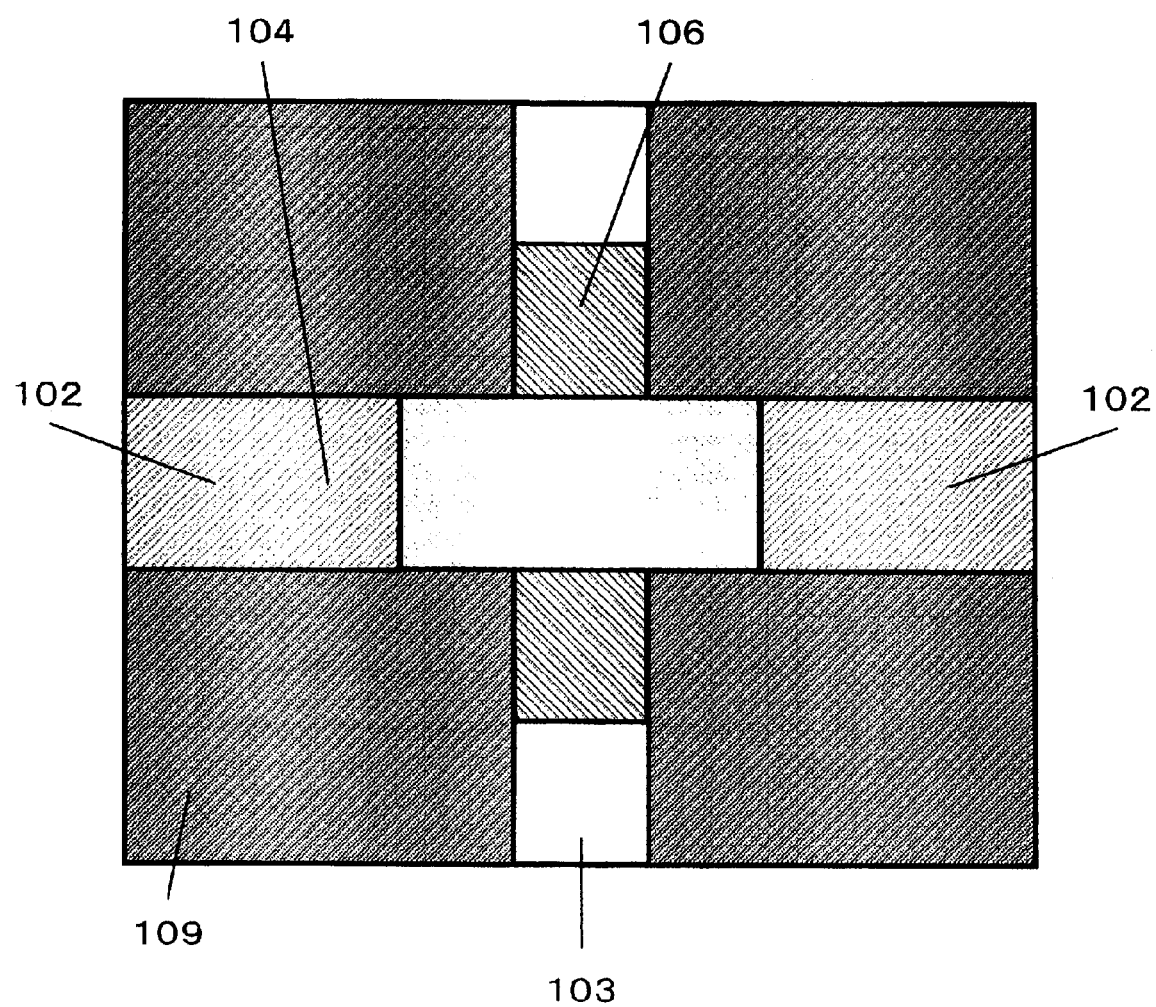
FIG. 8 is a plan diagram of the electromechanical memory of Embodiment 3 of the invention.

FIG. 7(b) is a circuit diagram showing the configuration of the electromechanical memory of Embodiment 3 of the invention illustrated in FIG. 7(a). FIG. 8 is a plan diagram of the electromechanical memory.

In the embodiment, a second electrode which is a lower electrode functions also as a word line. Therefore, the writing and reading mechanisms are slightly different from those of above-described Embodiments 1 and 2.

FIG. 9 is a view showing the control signal of the electromechanical memory of Embodiment 3 of the invention. The mechanisms of writing and reading a record in the electromechanical memory 300 will be described.

In writing, first, an electromechanical memory element 301 into which data 1 or 0 is to be written is selected from the electromechanical memory elements 301 arranged in a matrix pattern. Therefore, a potential difference is applied between the bit line 102 and word line 103 which intersect with each other at the position of the electromechanical memory element 301 to be made active. As shown in FIG. 7, the bit line 102 is connected to the movable electrode 104, and hence the potential difference is applied between the movable electrode 104 and the word line 103, thereby producing an electrostatic force. The movable electrode 104 is downward driven by the electrostatic force to make contact with the floating electrode 106. Namely, a switch is formed between the bit line 102 and the floating electrode 106.

In this case, as shown in FIG. 9(a), the driving voltage Vd is applied during a period of a driving time td of the movable electrode 104. A potential is supplied to the floating electrode 106 in which the switch is set to the ON-state, and a potential difference is produced between the floating electrode and the word line 103. In the case where the memory cell 105 is formed by an insulating material, the floating electrode 106 and the word line 103 constitute a capacitor, and therefore charges are accumulated because of the potential difference applied between the electrodes. In the embodiment, the word line 103 functions as a driving electrode of the switch, and also as an electrode of the memory cell 105. When the switch is driven, therefore, data is recorded. Consequently, the amount of charges which are accumulated in recording must be increased to be larger than charges which are accumulated in driving, to output the difference as an output. When data 1 is to be recorded, namely, a recording voltage Vm which is higher than the driving voltage Vd is applied from the driving time td to a recording time tm as shown in FIG. 9(a), thereby accumulating charges into the capacitor.

This state is a state where data 1 is recorded. After the charge accumulation into the capacitor is completed, the potential difference applied between the bit line 102 and the word line 103 is eliminated, whereby the lines are made to have the same potential, and the electrostatic force can be eliminated. The movable electrode 104 is upward driven by the elastic force of the doubly-supported beam to completely interrupt the electric conductive path to the floating electrode 106 in a mechanical manner, thereby attaining a switch OFF-state. According to this mechanism, an electric conductive path along which charges that have been once accumulated can escape is eliminated, and hence a nonvolatile memory in which the recording state does not deteriorate can be realized.

In reading, an electromechanical memory element 301 from which the recording state is to be read is selected from the electromechanical memory elements 301 arranged in a matrix pattern. Therefore, a potential difference is applied between the bit lines 102 and word line 103 which intersect with each other at the position of the electromechanical memory element 301 to be made active. In this case, as shown in FIG. 9(b), the driving voltage Vd is applied during the period of the driving time td of the movable electrode 104. The movable electrode 104 is downward driven by an electrostatic force to make contact with the floating electrode 106. In the case where charges of QOUT=CVm (C: electrostatic capacitance of the capacitor) are accumulated in the floating electrode 106 forming the capacitor, i.e., the case where data 1 is recorded, the charges escape to the contacting movable electrode 104 or the word line 103, and an output is taken out from the bit line 102 or the word line 103. In the case where the charges QOUT are not accumulated, i.e., the case where data 0 is recorded, an output is not obtained.

Writing of data 0 is identical with the reading operation. In the case where data 1 is already recorded, the data is rewritten to data 0, and, in the case where data 0 is already recorded, data 0 is rewritten. In the state where data 0 is recorded, an amount of charges Q0=CVd are accumulated.

In the embodiment, a control voltage is applied to one of the bit line 102 and the word line 103, and 0V is applied to the other one to which the control voltage is not applied.

As described above, it is possible to realize a nonvolatile electromechanical memory which performs operations of writing and reading a record. According to the configuration, a nonvolatile memory can be realized by a simple structure, and a high-performance electromechanical memory which is conventionally difficult to be realized, and in which the power consumption is low and the cost is low, and an electric apparatus using it can be realized.

In Embodiment 3 of the invention, the case where one memory cell is formed has been described. Alternatively, plural memory cells may be formed in the same manner as Embodiment 2.

As shown in FIG. 8, the size of the stack structure of the floating electrode 106, the memory cell 105, and the word line 103 can be increased.

According to the structure, the area of the memory cell can be widened, so that the electrostatic capacitance and the output can be increased. Since the electric field is applied between the floating electrode 106 in which charges are accumulated, and the movable electrode 104, the structure is effective also as a countermeasure against the phenomenon that the electric field between the word line 103 and the movable electrode 104 is interrupted. According to the configuration, charges accumulated in the floating electrode 106 can be dispersed in a wide range, and an influence of shielding can be reduced by lowering the field strength.

In Embodiment 3, the case where the memory cell has a rectangular shape has been described. The memory cell may have any shape including a circular shape, and may be formed into any shape as far as the space allows.

Figure 10A:
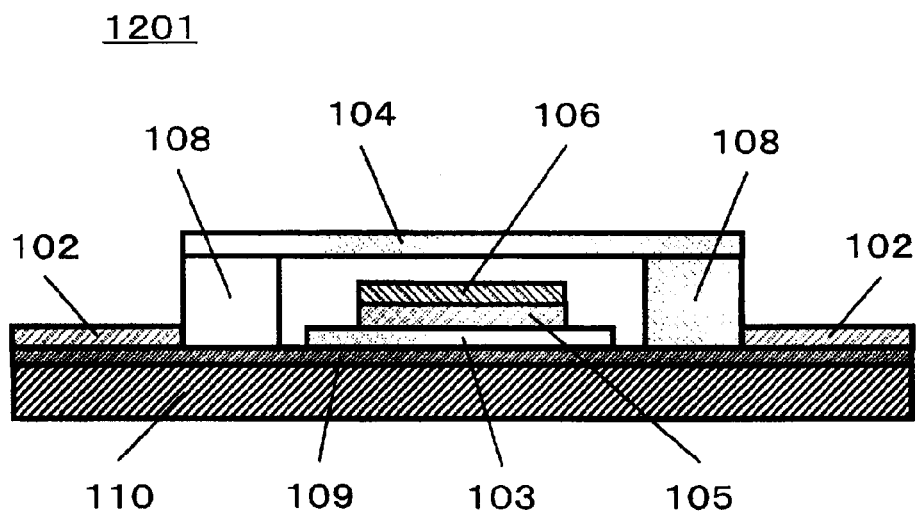
FIG. 10(a) is a sectional view showing the configuration of the electromechanical memory of Embodiment 3 of the invention.
Figure 10B:
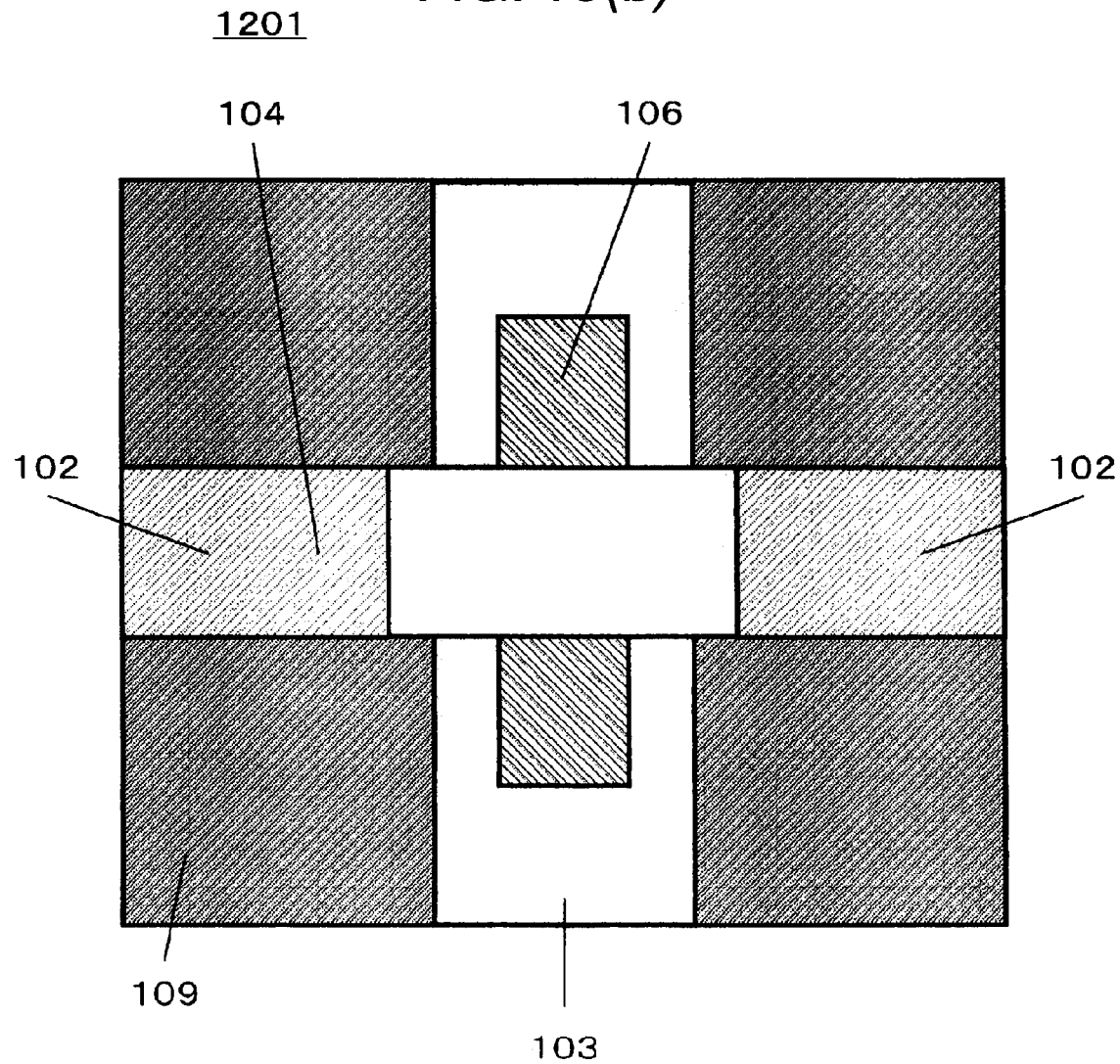
FIG. 10(b) is a plan diagram showing the configuration of the electromechanical memory of Embodiment 3 of the invention.

FIG. 10(a) is a sectional view showing the configuration of the electromechanical memory of Embodiment 3 of the invention, and FIG. 10(b) is a plan diagram of the electromechanical memory. The electromechanical memory 1201 is configured so that the word line 103 is wider in width than the floating electrode 106, and the opposing area between the movable electrode 104 and the floating electrode 106 is larger than that between the movable electrode 104 and the word line 103.

This configuration is effective as a countermeasure against the shielding of the electric field between the word line 103 and the movable electrode 104 due to that between the floating electrode 106 in which charges are accumulated, and the movable electrode 104. When the opposing area between the movable electrode 104 and the word line 103 is widened, the electrostatic capacity can be increased, and the electric field can be enhanced. An influence of shielding can be reduced.

Embodiment 4

Figure 11A:
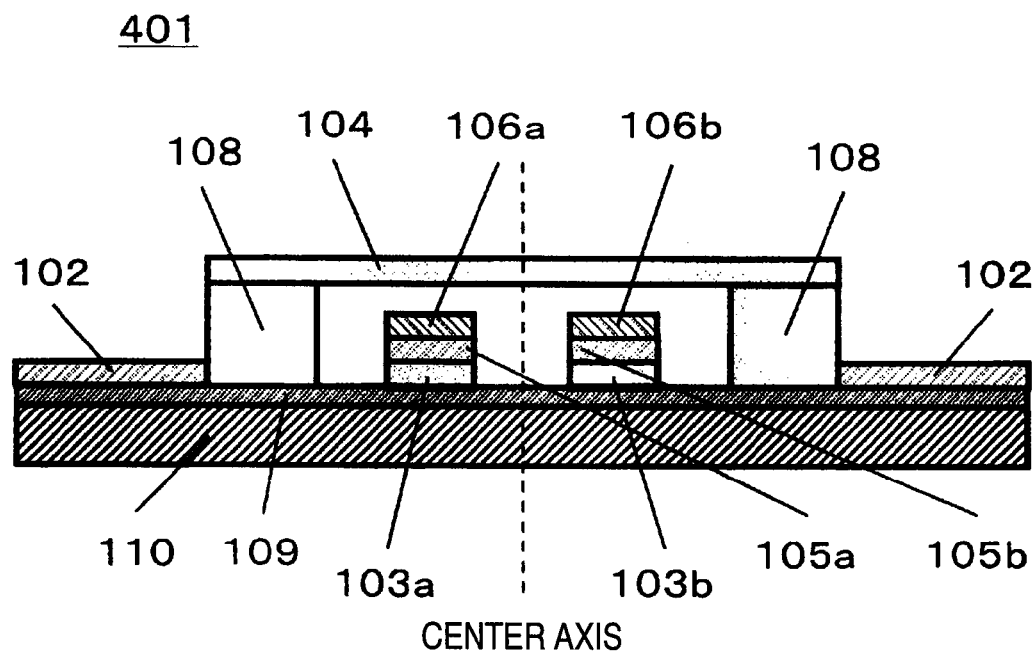
FIG. 11(a) is a sectional view showing the configuration of an electromechanical memory of Embodiment 4 of the invention.
Figure 11B:
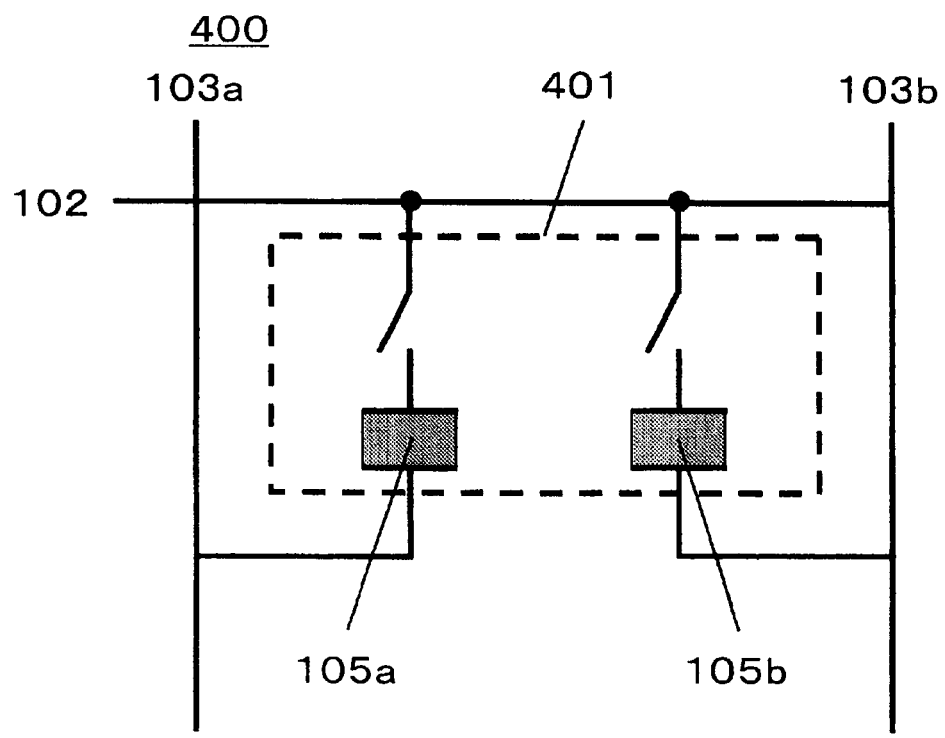
FIG. 11(b) is a circuit diagram showing the configuration of the electromechanical memory of Embodiment 4 of the invention.

FIG. 11 is a sectional view showing the configuration of an electromechanical memory of Embodiment 4 of the invention.

In the electromechanical memory shown in FIG. 11, with respect to the beam-like movable electrode 104 formed by the bit line 102, word lines 103a, 103b for forming a capacitor are formed by memory cells 105a, 105b configured by an insulating material formed in an upper layer, and floating electrodes 106a, 106b. At intersections of the word lines 103a, 103b, electromechanical memory elements 401 are formed. The electromechanical memory elements 401 are arranged in a matrix pattern, thereby constituting the electromechanical memory 400. The embodiment is characterized in that the word line 103, and the lower electrode 107 in Embodiments 1 and 2 are used in common. In the same manner as Embodiments 1 and 2, above the word line 103, the bit line 102 is formed in the air to configure a structure in which the beam-like movable electrode 104 is formed.

FIG. 11(a) is a sectional view showing the configuration of the electromechanical memory of Embodiment 3 of the invention, and shows a sectional view along the direction of the bit line 102. In the electromechanical memory element 401 shown in FIG. 11(a), the memory cell, floating electrode, and word electrode which constitute a capacitor are split into two portions, in contrast to the electromechanical memory element 301 shown in Embodiment 3. They are indicated as memory cells 105*a*, 105*b*, and floating electrodes 106*a*, 106*b*. Two independent word lines 103*a*, 103*b* are inserted into one electromechanical memory element 401.

FIG. 11(*b*) is a circuit diagram showing the configuration of the electromechanical memory of Embodiment 4 of the invention illustrated in FIG. 11(*a*).

The mechanisms of writing and reading a record, and selecting a memory cell in the electromechanical memory are identical with those of the electromechanical memory element 300 of Embodiment 3 and the electromechanical memory 200 of Embodiment 2.

Two record data can be recorded by one electromechanical memory element 401, or the record capacity can be expanded from a one-switch and one-memory cell configuration to a one-switch and two-memory cell configuration.

In Embodiment 4 of the invention, the case of two memory cells has been described. Alternatively, three or more memory cells may be formed.

As described above, according to the electromechanical memory of Embodiment 3, one electromechanical memory element can record plural record data, and a one-switch and plural-memory cell configuration can be formed to expand the record capacity.

Embodiment 5

Next, methods of producing the electromechanical memories which have been described above will be described. Hereinafter, the method of producing the electromechanical memory 100 of Embodiment 1 will be described. FIGS. 12(*a*) to 12(*d*) are sectional views stepwise illustrating production steps of the electromechanical memory of Embodiment 1 of the invention.

First, as shown FIG. 12(*a*), the insulating film 109 such as SiO2, Si3N4, or a laminated film of these materials is formed by thermal oxidation or sputtering on the substrate 110 such as Si or GaAs. Next, a conducting material to be formed as the word line 103, such as Al, Au, or Cu is formed by sputtering or CVD (Chemical Vapor Deposition). Thereafter, a resist having a pattern of the lower electrode 103 is formed on the material to be formed as the lower electrode 103, by electron beam lithography, photolithography, or the like, and shaped by dry etching, wet etching, or the like. The resist is removed away by ashing or the like.

On the resulting structure, moreover, a conducting material to be formed as the lower electrode 107, such as Al, Au, or Cu, an insulating material to be formed as the memory cell 105, such as SiO2 or Si3N4, and a conducting material to be formed as the floating electrode 106, such as Al, Au, or Cu are formed as shown in FIG. 12(*b*) by repeating steps of deposition, patterning of a resist by photolithography, and etching.

Next, as shown in FIG. 12(*c*), a material to be formed as a sacrifice layer 111, such as a photoresist or SiO2 is formed, a conducting material to be formed as the bit line 102, the post portion 108, and the movable electrode 104, such as Al, Au, or Cu is formed by sputtering, CVD, or the like on the material, and thereafter a resist having patterns of the bit line 102, the post portion 108, and the movable electrode 104 is formed by electron beam lithography, photolithography, or the like, and shaped by dry etching, wet etching, or the like. Finally, the sacrifice layer 111 is removed away by ashing or wet etching to produce a hollow structure of the movable electrode 104 such as shown in FIG. 12(*d*).

In this way, a high-quality electromechanical memory having high dimensional accuracy can be obtained very easily. In the embodiment described above, the method of producing the electromechanical memory of Embodiment 1 has been described. It is a matter of course that the electromechanical memories of Embodiments 2 to 4 can be similarly formed.

Embodiment 6

Figure 13:
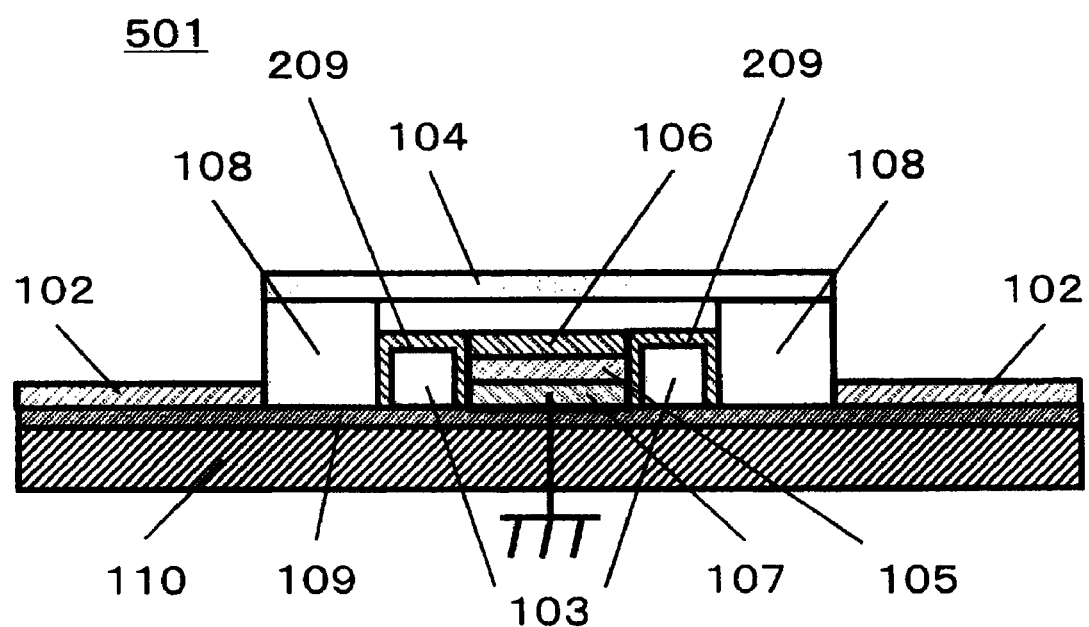
FIG. 13 is a sectional view showing the configuration of an electromechanical memory of Embodiment 6 of the invention.

Next, another structure for attaining miniaturization will be described. FIG. 13 is a sectional view showing the configuration of an electromechanical memory of Embodiment 6 of the invention. A electromechanical memory element 501 shown in FIG. 13 is characterized in that, in order to minimize the intervals among the post portion 108 connected to the bit line 102, the word line 103, and the lower electrode 107, and prevent a short circuit from occurring, an insulating film 209 which is configured by a thermal oxidation film or the like is placed among them. According to the configuration, the width of the electromechanical memory element can be greatly reduced.

The other is formed in the same manner as above-described Embodiment 1. The interposition of the insulating film which is highly insulative ensures insulating separation. Therefore, the wiring distance can be reduced, and miniaturization can be realized. As shown in FIG. 14(*d*) which will be described later, the insulating film 209 may be formed only on the sidewall of the word line 103.

FIGS. 14(*a*) to 14(*d*) show sectional views stepwise illustrating production steps of the electromechanical memory of Embodiment 6 of the invention.

First, the insulating film 109 such as SiO2, Si3N4, or a laminated film of these materials is formed by thermal oxidation or sputtering on the substrate 110 such as Si or GaAs. Next, a conducting material to be formed as the word line 103, such as polysilicon, Al, Au, or Cu is formed by sputtering or CVD (Chemical Vapor Deposition). Thereafter, a resist having a pattern of the word line 103 is formed on the material to be formed as the word line 103, by electron beam lithography, photolithography, or the like, and the conducting material is patterned by dry etching, wet etching, or the like. The resist is removed away by ashing or the like.

As shown in FIG. 14(*a*), thereafter, the insulating film 209 is formed in the periphery of the word line 103. For example, the word line is formed by a stack structure of polysilicon and a tungsten layer. In this state, the word line is patterned, and then thermal oxidation is performed. As a result, the insulating film 209 is formed only on the sidewall of the word line.

Alternatively, a silicon oxide film or a silicon nitride film may be formed by the CVD method, and the insulating film 209 may be caused to remain only on the sidewall of the word line by anisotropic etching. A thin silicon oxide film is formed by thermal oxidation in advance of the film formation by the CVD method, and the CVD film is formed on the film, whereby the insulating property is ensured and the reliability of the element can be improved.

In this configuration, the insulating film 209 may be formed not only on the sidewall of the word line 103, but also on the upper portion. In the case where the insulating film 209 exists also on the word line 103, even when the movable electrode is displaced to make contact with the insulating film 209 on the word line 103, the potential difference between the word line and the bit line can be maintained, and the displacement of the movable electrode 104 can be stably maintained.

In the case where the insulating film 209 is formed only on the sidewall of the word line 103, the upper face of the word line must be sufficiently lower than that of the floating electrode 106 so that, even when the movable electrode 104 is displaced to a degree in which the electrode makes contact with the floating electrode, the upper face of the word line does not make contact with that of the floating electrode 106.

Figure 12A:
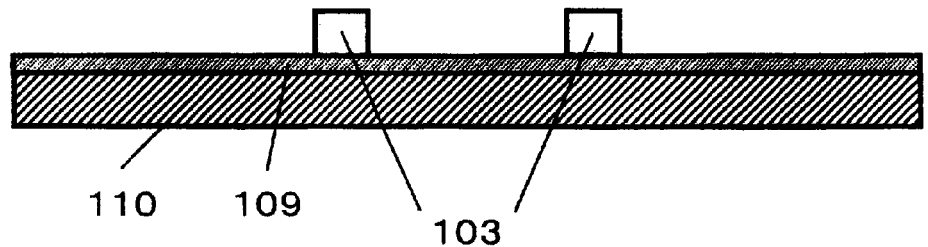
FIG. 12 is a sectional view stepwise illustrating production steps of an electromechanical memory of Embodiment 5 of the invention.
Figure 12B:
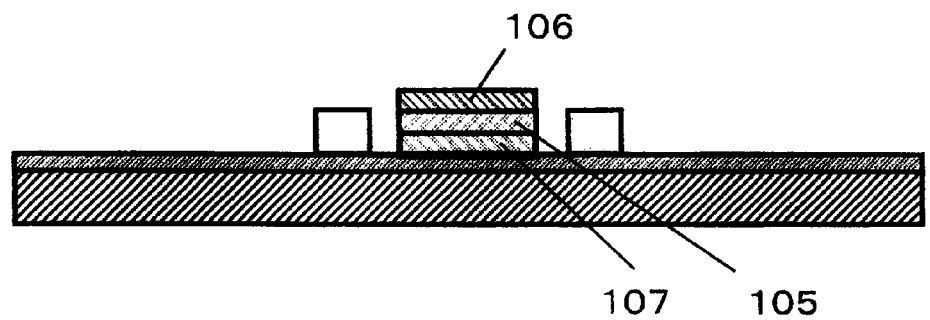
Figure 12C:
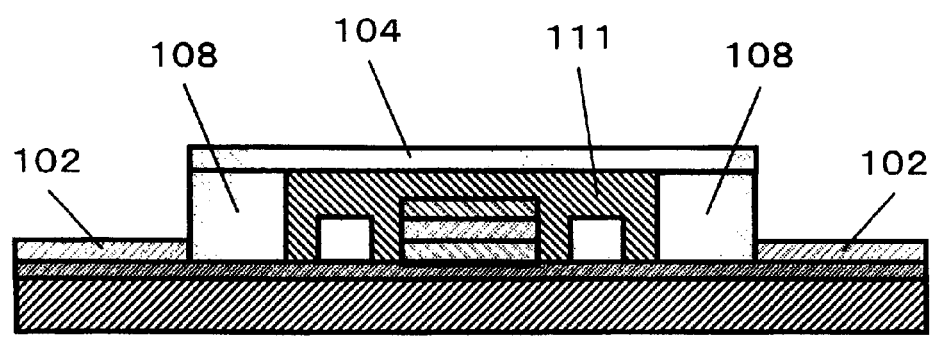
Figure 12D:
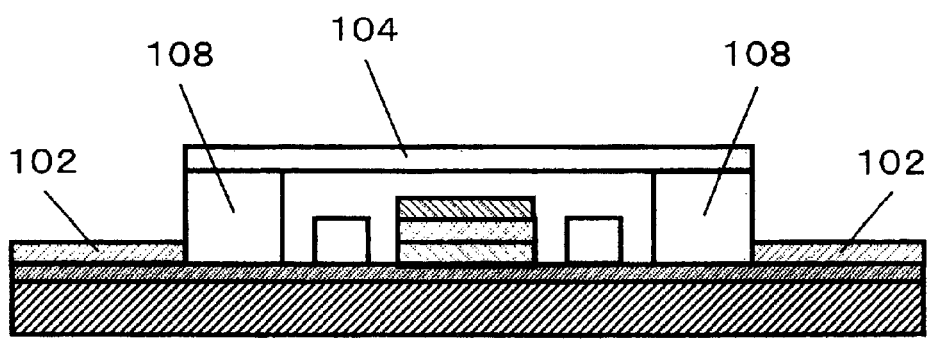
Figure 14A:
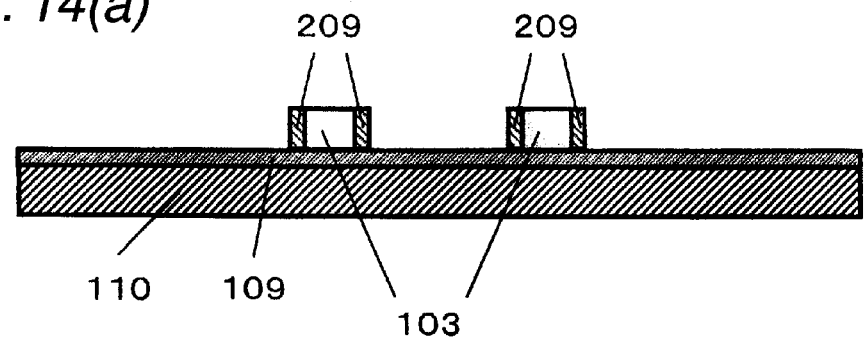
FIG. 14 is a sectional view showing production steps of an electromechanical memory of Embodiment 6 of the invention.
Figure 14B:
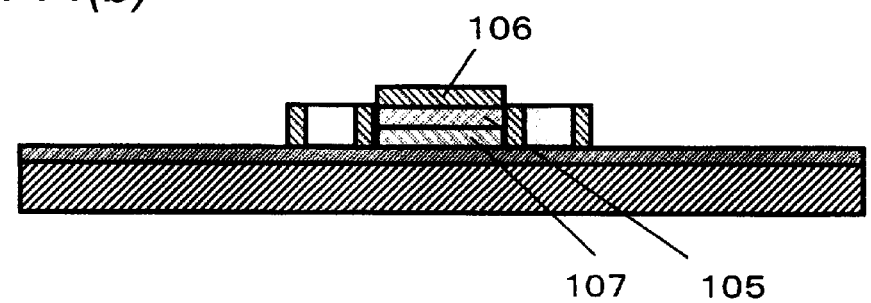
Figure 14C:
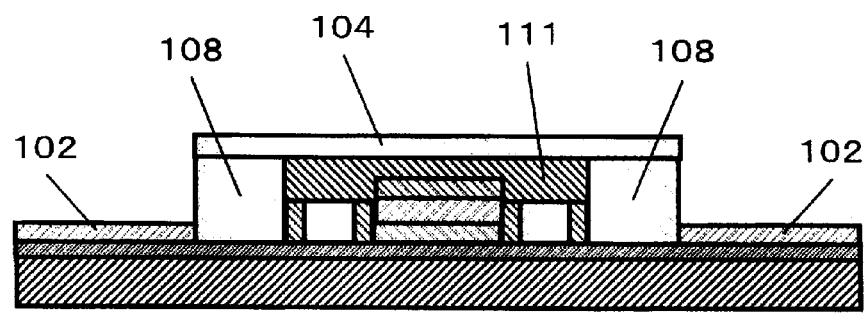
Figure 14D:
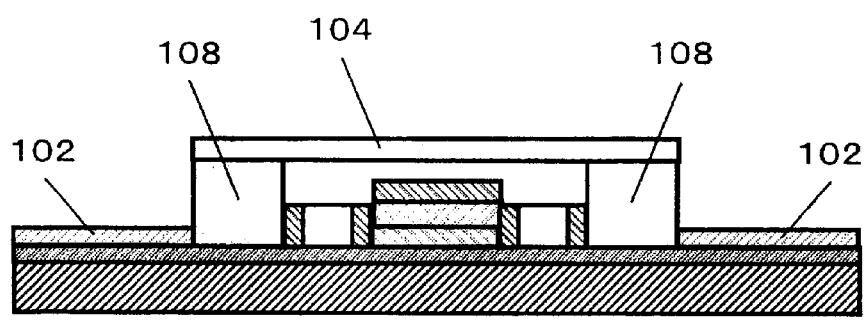

The subsequent steps are identical with those of above-described Embodiment 5 shown in FIG. 12(b) to 12(d). Although description is omitted, as shown in FIG. 14(b) to 14(d), a photoresist or SiO2 as the sacrifice layer 111 is formed, the movable electrode 104 is formed on the layer, and thereafter the sacrifice layer 111 is removed away, thereby forming a micro electromechanical memory having a beam-like structure in which the movable electrode 104 is stretched on the post portion 108.

According to the configuration, miniaturization is facilitated, and a margin for patterning is not necessary in patterning. Therefore, it is possible to obtain an electromechanical memory in which significant miniaturization is enabled, and which has a high reliability. The heights of the word line 103 and the floating electrode 106 are not always required to coincide with each other. When an insulating film is formed on the word line 103 as shown in FIG. 13, the heights of the word line 103 and the floating electrode 106 can be set to the same level, and the film thickness of the word line can be maximumly increased. Even when the line width is reduced, therefore, sufficient conductivity can be obtained, and the transmission loss can be reduced. This is effective in further miniaturization.

Embodiment 7

Figure 15:
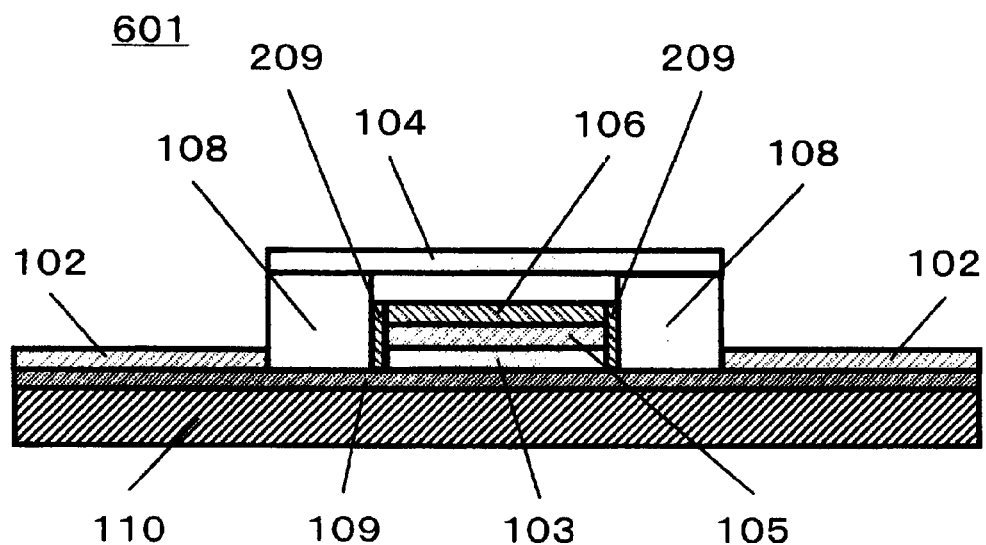
FIG. 15 is a sectional view showing the configuration of an electromechanical memory of Embodiment 7 of the invention.

FIG. 15 is a sectional view showing the configuration of an electromechanical memory of Embodiment 7 of the invention. In the electromechanical memory shown in FIG. 15, on the (silicon) substrate 110, electromechanical memory elements 601 are formed at positions where the bit lines 102 and the word lines 103 intersect with each other, and the electromechanical memory elements 601 are arranged in a matrix pattern. The movable electrode 104 connected to the bit line 102 has a structure in which it is formed in the air above the word line 103. The electromechanical memory is formed in the same manner as the electromechanical memory of Embodiment 3 shown in FIG. 7 except that the insulating film 209 is interposed between the stack structure of the word line 103, the memory cell 105, and the floating electrode 106, and the post portion 108.

According to the configuration, insulating separation is enabled simply by setting the film thickness of the insulating film 209 to a level at which insulating separation can be performed between the post portion 108 and the floating electrode 106. Therefore, significant miniaturization is enabled. Namely, also the insulating property can be ensured simply be forming an insulating film 208 on the sidewall of the stack structure of the word line, the memory cell, and the floating electrode, and forming the post portion 108 so as to butt against the sidewall. Therefore, further miniaturization can be formed.

Embodiment 8

Figure 16:
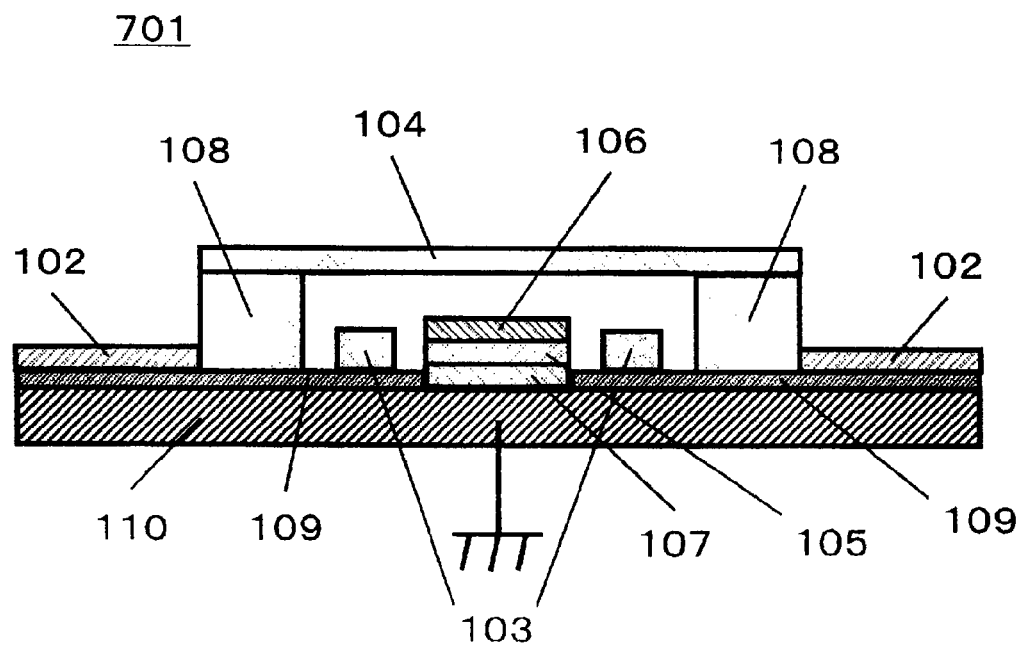
FIG. 16 is a sectional view showing the configuration of an electromechanical memory of Embodiment 8 of the invention.

FIG. 16 is a sectional view showing the configuration of an electromechanical memory of Embodiment 8 of the invention. An electromechanical memory element shown in FIG. 16 is different from the electromechanical memory element of Embodiment 1 shown in FIG. 2 in that, in the electromechanical memory element 701 of the embodiment, the lower electrode 107 is formed directly on the substrate 110, whereby electrical connection of the substrate 110 and the lower electrode 107 is realized. The other structure is identical with the electromechanical memory element of Embodiment 1.

In production, a conductive layer constituting the lower electrode 107 is formed on a silicon substrate, the layer is patterned, and thereafter the insulating film 109 is formed. According to the structure, the rear face of the substrate can be grounded, and the structure is simplified. Furthermore, the height of the whole capacitor is reduced by a degree corresponding to the insulating film. Therefore, the surface can be flattened, and patterning in a subsequent step is facilitated. Consequently, further miniaturization is enabled.

According to the configuration, simplification, thinning, and miniaturization of the structure can be performed.

In order to increase the capacity, irregularities may be formed in the surface of the lower electrode 107, so that the capacitor area can be increased.

Embodiment 9

Figure 17:
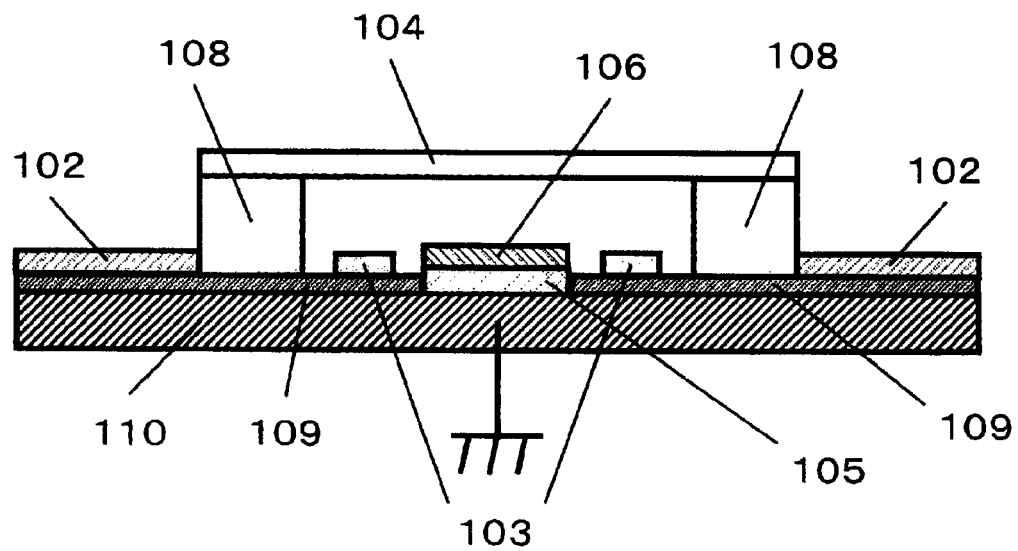
FIG. 17 is a sectional view showing the configuration of an electromechanical memory of Embodiment 9 of the invention.

FIG. 17 is a sectional view showing the configuration of an electromechanical memory element in Embodiment 9 of the invention. The electromechanical memory element 801 shown in FIG. 17 is characterized in that the lower electrode 107 in the electromechanical memory element of Embodiment 8 shown in FIG. 16 is not disposed, an insulating film 105 which directly constitutes the memory cell is formed on the substrate 110, and a capacitor is configured between the substrate 110 and the floating electrode 106. The other structure is identical with the electromechanical memory element of Embodiment 8.

The structure can be obtained by forming the insulating film 105 which directly constitutes the memory cell on the silicon substrate, without forming the conductive layer for configuring the lower electrode 107 on the silicon substrate.

According to the structure, in the same manner as Embodiment 8, the rear face of the substrate can be grounded, and the structure is further simplified. As compared with the structure of Embodiment 8, the height of the whole capacitor is further reduced by a degree corresponding to the lower electrode. Therefore, the surface can be further flattened, and patterning in a subsequent step is facilitated. Consequently, further miniaturization is enabled.

Embodiment 10

Figure 18:
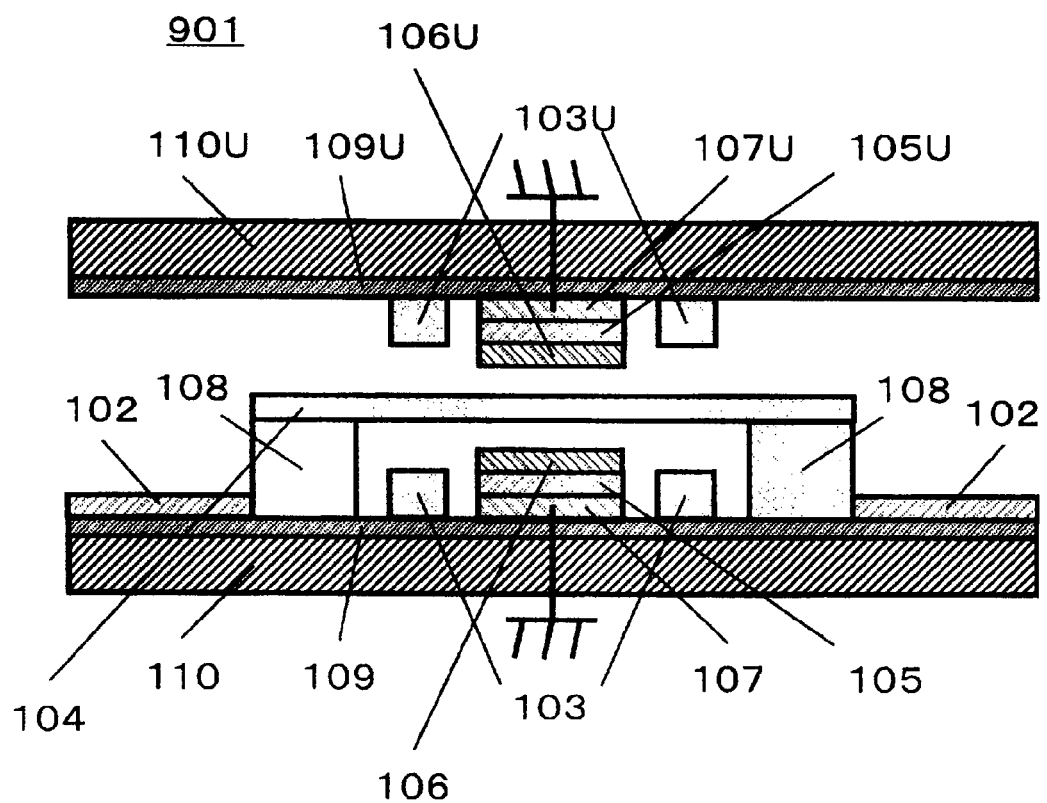
FIG. 18 is a sectional view showing the configuration of an electromechanical memory of Embodiment 10 of the invention.

FIG. 18 is a sectional view showing the configuration of an electromechanical memory element in Embodiment 10 of the invention. In the electromechanical memory element 901 shown in FIG. 18, an upper substrate 110U in which a lower electrode 107U, a memory cell 105U formed by an insulating material, and a floating electrode 106U are stacked on the surface is placed so that the floating electrode 106U is positioned with being separated by a predetermined gap from the movable electrode 104 of the electromechanical memory element of Embodiment 1 shown in FIG. 2, whereby the electrostatic capacitance of the memory cell is increased.

According to the structure, in data writing, an upper word line 103U is set to the same potential as the bit line 102, so that an electrostatic force acts with respect to the lower word line 103, the movable electrode is downward displaced, and charges are accumulated in the memory cell 105. Then, the lower word line 103 is set to the same potential as the bit line 102, and a voltage is applied to the upper word line 103U, so that an electrostatic force acts between the movable electrode 104 connected to the bit line 102, and the upper word line 103U, the movable electrode is upward displaced, and charges are accumulated in the memory cell 105U.

In this way, charges are accumulated in the upper and lower memory cells, whereby a double amount of charges can be accumulated.

In Embodiment 10, the case where one movable electrode and two memory cells are disposed has been described. In one electromechanical memory element, plural movable electrodes, and plural memory cells can be formed.

Embodiment 11

Figure 19:
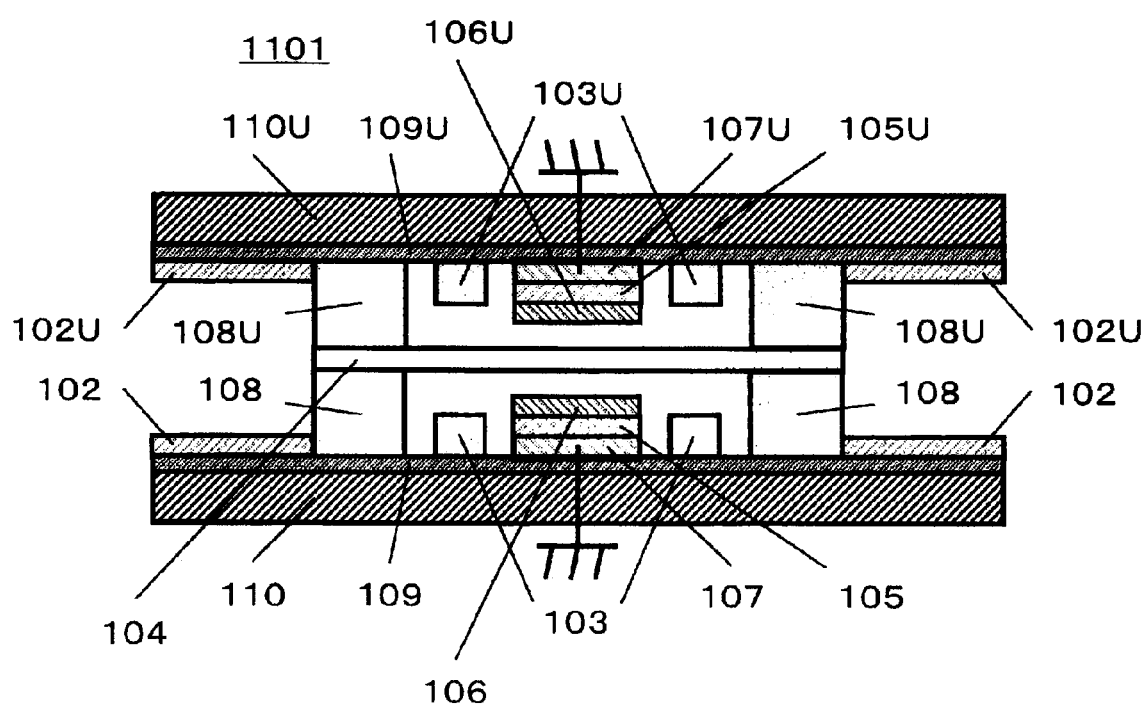
FIG. 19 is a sectional view showing the configuration of an electromechanical memory of Embodiment 11 of the invention.

FIG. 19 is a sectional view showing the configuration of an electromechanical memory element in Embodiment 11 of the invention. The electromechanical memory element 1101 shown in FIG. 19 is identical in common use of the movable electrode 104 with the electromechanical memory element of Embodiment 10 shown in FIG. 18. However, a bit line 102U is formed also in the upper substrate 110U, and a one-switch and two-memory cell configuration which has two memory cells 105, 105U for the one movable electrode 104 is formed.

In this structure, the storage capacity of the electromechanical memory can be increased.

In Embodiment 11, the case where one movable electrode and two memory cells are disposed has been described. In one electromechanical memory element, plural movable electrodes, and plural memory cells can be formed, and the storage capacity of the electromechanical memory can be increased. For example, a one-switch and four-memory cell (1S4C) type may be formed.

Embodiment 12

Figure 20:
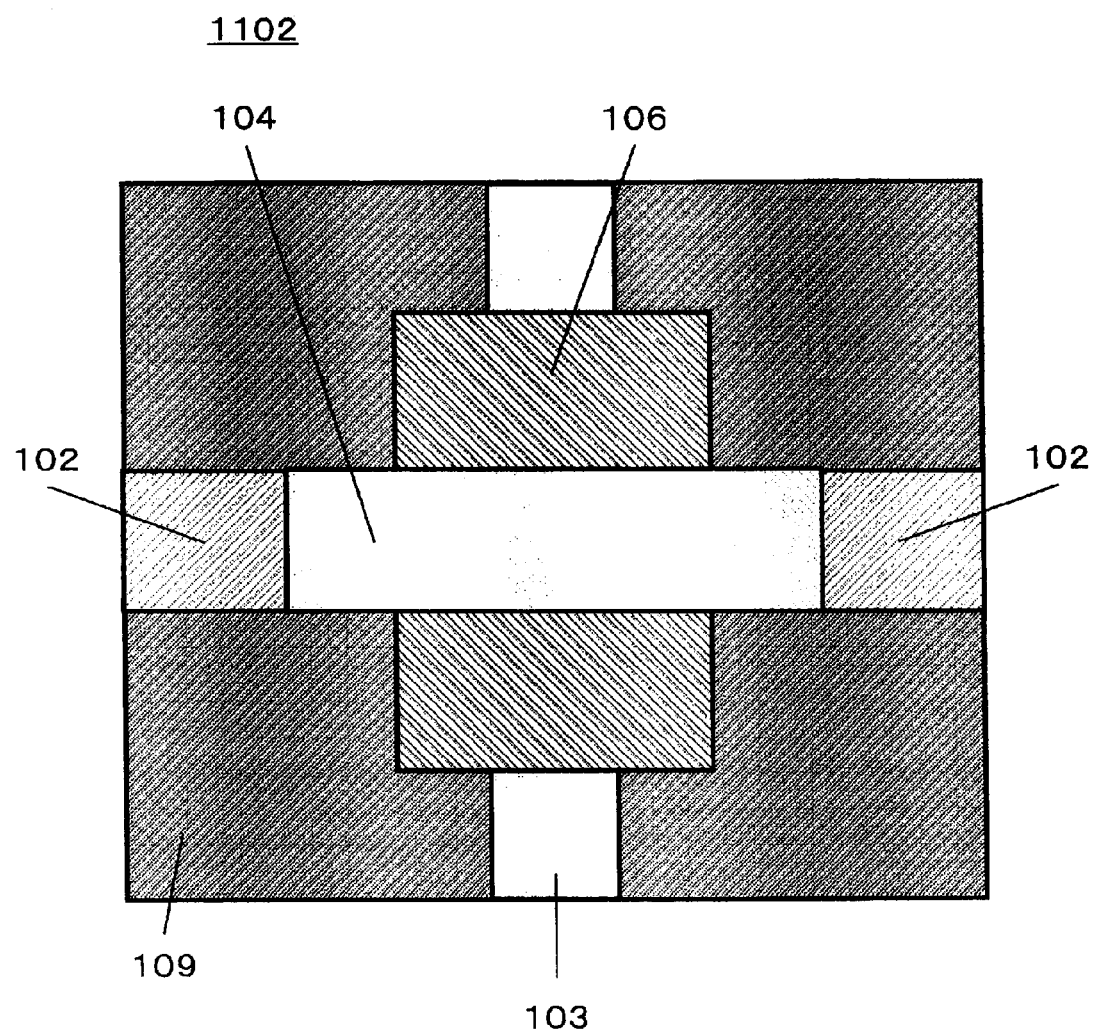
FIG. 20 is a plan diagram showing the configuration of an electromechanical memory of Embodiment 12 of the invention.

FIG. 20 is a plan diagram showing the configuration of an electromechanical memory element in Embodiment 12 of the invention. The electromechanical memory element 1102 shown in FIG. 20 is identical with the electromechanical memory element of Embodiment 3 which is shown in the plan diagram of FIG. 8, except that the stack structure of the floating electrode 106, the memory cell 105, and the word line 103 has a different size.

In Embodiment 3 shown in FIG. 8, the word line 103 and the memory cell 105 are configured so as to have a substantially same width. By contrast, this structure is characterized in that the width of the stack structure of the floating electrode 106, the memory cell 105, and the word line 103 is larger than that of the word line 103. According to the configuration, the area of the memory cell can be widened, so that the electrostatic capacitance and the output can be increased.

In Embodiment 12, the case where the memory cell has a rectangular shape has been described. The memory cell may have any shape including a circular shape, and may be formed into any shape as far as the space allows.

The structure of Embodiment 12 in which the area of the memory cell is increased can be applied also to the stack structure of Embodiment 1 which is shown in the plan diagram of FIG. 5, and which consists of the floating electrode 106, the memory cell 105, and the lower electrode 107.

The electromechanical memories of Embodiments 2 to 4, 8, 9, 10, 11, and 12 can be produced by a production method which is similar to the method of producing the electromechanical memory 100 of Embodiment 5 of the invention.

The electromechanical memory of Embodiment 7 can be produced by a production method which is similar to the method of producing the electromechanical memory of Embodiment 6 of the invention.

INDUSTRIAL APPLICABILITY

The electromechanical memory of the invention enables a nonvolatile memory to be realized by a simple structure, and is useful in a high-performance electromechanical memory which is conventionally difficult to be realized and in which the power consumption is low and the cost is low, and an electric apparatus using it.

The invention claimed is:

1. An electromechanical memory formed on a substrate, comprising:
   a memory portion which is formed on the substrate so that a memory cell is interposed between a first electrode and a second electrode; and
   a switching portion which has a movable electrode that is a beam-like member stretched above a post portion formed on the substrate, while being separated from the first electrode by a predetermined distance, and which is formed so that an electric conductive path can be formed between the first electrode and the movable electrode by displacement of the movable electrode caused by an electrostatic force, and
   wherein the writing and reading data into and from the memory cell is performed.

2. The electromechanical memory according to claim 1, wherein the electrostatic force is produced by a potential difference between a driving electrode placed in the vicinity of the memory portion, and the movable electrode.

3. The electromechanical memory according to claim 2, wherein the driving electrode is formed so as to butt against the memory portion or the post portion through an insulating film which covers a sidewall of the driving electrode.

4. The electromechanical memory according to claim 2, wherein the driving electrode is opposed to the movable electrode through an insulating film.

5. The electromechanical memory according to claim 2, wherein a plurality of electromechanical memories are formed on the substrate, and the driving electrode constitutes a word line.

6. The electromechanical memory according to claim 2, wherein the driving electrode is configured by two stationary electrodes which are juxtaposed on both sides of the memory portion.

7. The electromechanical memory according to claim 1, wherein the electrostatic force is produced by a potential difference between the second electrode and the movable electrode.

8. The electromechanical memory according to claim 7, wherein the post portion is formed so as to butt against the memory portion through an insulating film which covers a sidewall of the memory portion.

9. The electromechanical memory according to claim 7, wherein a plurality of electromechanical memories are formed on the substrate, and the second electrode constitutes a word line.

10. The electromechanical memory according to claim 1, wherein the memory portion is configured by a plural of juxtaposed memory portions.

11. The electromechanical memory according to claim 10, wherein in the memory portions, at least one of the first and second electrodes is connected to a common potential.

12. The electromechanical memory according to claim 10, wherein in the memory portions, at least one of the first and second electrodes is connected to potentials which are independent of each other.

13. The electromechanical memory according to claim 1, wherein a second memory portion is disposed so as to be symmetrical to the memory portion across the movable electrode.

14. The electromechanical memory according to claim 1, wherein the memory is formed so that an area of the memory portion is larger than an area opposed to the movable electrode.

15. The electromechanical memory according to claim 1, wherein the memory is formed so that an area of the second electrode is larger than an area of the first electrode.

16. The electromechanical memory according to claim 1, wherein a plurality of electromechanical memories are formed on the substrate, and the movable electrode constitutes a bit line.

17. The electromechanical memory according to claim 1, wherein the memory cell is formed by an insulating material.

18. The electromechanical memory according to claim 1, wherein the memory cell is formed by a dielectric material.

19. The electromechanical memory according to claim 1, wherein the electrodes between which the memory cell is interposed are formed by a magnetic material.

20. An electric circuit using the electromechanical memory according to claim 1.

21. A method of driving an electromechanical memory for performing the writing and reading data into and from the memory cell, the method comprising:
   providing the electromechanical memory which includes:
      a memory portion which is formed on a substrate so that a memory cell is interposed between a first electrode and a second electrode; and
   a switching portion which has a movable electrode that is a beam-like member stretched above a post portion formed on the substrate, while being separated from the first electrode by a predetermined distance, and which is formed so that an electric conductive path can be formed between the first electrode and the movable electrode caused by displacement of the movable electrode by an electrostatic force produced by a potential difference between the second electrode and the movable electrode; and
   controlling a potential of the second electrode so that a writing voltage is higher than a writing switch driving voltage and a reading switch driving voltage in the writing, thereby performing writing and reading.

* * * * *